(12) United States Patent
Hsueh

(10) Patent No.: US 11,842,960 B2
(45) Date of Patent: Dec. 12, 2023

(54) SEMICONDUCTOR DEVICE WITH HORIZONTALLY ARRANGED CAPACITOR

(71) Applicant: NANYA TECHNOLOGY CORPORATION, New Taipei (TW)

(72) Inventor: Yu-Han Hsueh, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/122,228

(22) Filed: Mar. 16, 2023

(65) Prior Publication Data

US 2023/0223333 A1    Jul. 13, 2023

Related U.S. Application Data

(62) Division of application No. 17/352,681, filed on Jun. 21, 2021, now Pat. No. 11,646,262.

(51) Int. Cl.

| H01L 23/522 | (2006.01) |
|---|---|
| H01L 23/528 | (2006.01) |
| H01L 23/64 | (2006.01) |
| H01L 49/02 | (2006.01) |

(52) U.S. Cl.
CPC ...... *H01L 23/5223* (2013.01); *H01L 23/5283* (2013.01); *H01L 28/86* (2013.01); *H01L 28/87* (2013.01); *H01L 28/88* (2013.01)

(58) Field of Classification Search
CPC ......... H01L 28/40; H01L 28/60; H01L 28/87; H01L 28/88; H01L 28/86; H01L 28/91; H01L 28/92; H01L 23/5223; H01L 23/5283; H01L 23/642; H01L 23/528; H01L 23/522

See application file for complete search history.

(56) References Cited

U.S. PATENT DOCUMENTS

| 8,319,313 B1* | 11/2012 | Ben Artsi ........... | H01L 23/5223 257/532 |
|---|---|---|---|
| 2006/0157792 A1* | 7/2006 | Konushi ................ | H01G 4/306 257/359 |
| 2009/0097186 A1* | 4/2009 | Topaloglu ............... | H01L 28/90 29/25.42 |
| 2013/0154055 A1* | 6/2013 | Park ........................ | H01L 28/60 257/532 |

(Continued)

*Primary Examiner* — Omar F Mojaddedi
(74) *Attorney, Agent, or Firm* — Xuan Zhang

(57) ABSTRACT

The present application discloses a semiconductor device with a horizontally arranged capacitor. The semiconductor device includes a first palm portion positioned above a substrate; a second palm portion positioned above the substrate and opposite to the first palm portion; a first finger portion arranged substantially in parallel with a main surface of the substrate, positioned between the first palm portion and the second palm portion, and connecting to the first palm portion; a second finger portion arranged substantially in parallel with the first finger portion, positioned between the first palm portion and the second palm portion, and connecting to the second palm portion; a capacitor insulation layer positioned between the first finger portion and the second finger portion; a first spacer positioned between the first palm portion and second finger portion; and a second spacer positioned between the second palm portion and the first finger portion.

17 Claims, 28 Drawing Sheets

(56) References Cited

U.S. PATENT DOCUMENTS

| | | | | |
|---|---|---|---|---|
| 2013/0277803 | A1* | 10/2013 | Pagani | ............... H01L 23/5223 257/532 |
| 2016/0276265 | A1* | 9/2016 | Iwabuchi | ................ H01L 28/60 |
| 2019/0385947 | A1* | 12/2019 | Li | ........................ H01L 23/528 |
| 2022/0406768 | A1* | 12/2022 | Chen | ...................... H01L 28/60 |

* cited by examiner

SEMICONDUCTOR DEVICE WITH HORIZONTALLY ARRANGED CAPACITOR

CROSS-REFERENCE TO RELATED APPLICATION

This application is a divisional application of U.S. Non-Provisional application Ser. No. 17/352,681 filed 21 Jun. 2021, which is incorporated herein by reference in its entirety.

TECHNICAL FIELD

The present disclosure relates to a semiconductor device and a method for fabricating the semiconductor device, and more particularly, to a semiconductor device with a horizontally arranged capacitor and the method for fabricating the semiconductor device with the horizontally arranged capacitor.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first palm portion positioned above a substrate; a second palm portion positioned above the substrate and opposite to the first palm portion; a first finger portion arranged substantially in parallel with a main surface of the substrate, positioned between the first palm portion and the second palm portion, and connecting to the first palm portion; a second finger portion arranged substantially in parallel with the first finger portion, positioned between the first palm portion and the second palm portion, and connecting to the second palm portion; a capacitor insulation layer positioned between the first finger portion and the second finger portion; a first spacer positioned between the first palm portion and second finger portion; and a second spacer positioned between the second palm portion and the first finger portion.

In some embodiments, the semiconductor device includes a bottom conductive layer arranged substantially in parallel with the second finger portion, positioned between the first palm portion and the second palm portion, and connecting to the first palm portion.

In some embodiments, the semiconductor device includes a third spacer positioned between the bottom conductive layer and the second palm portion.

In some embodiments, the semiconductor device includes an impurity region positioned in the substrate. The first palm portion is positioned on the impurity region and contacting the impurity region.

In some embodiments, the semiconductor device includes an impurity region positioned in the substrate. The second palm portion is positioned on the impurity region and contacting the impurity region.

In some embodiments, the semiconductor device includes a stop layer arranged substantially in parallel with the capacitor insulation layer and positioned between the second finger portion and the bottom conductive layer.

In some embodiments, the semiconductor device includes a bottom conductive layer arranged substantially in parallel with the second finger portion, positioned between the first palm portion and the second palm portion, and connecting to the second palm portion.

In some embodiments, the semiconductor device includes a third spacer positioned between the bottom conductive layer and the first palm portion.

In some embodiments, the semiconductor device includes an impurity region positioned in the substrate. The first palm portion is positioned on the impurity region and contacting the impurity region.

In some embodiments, the semiconductor device includes an impurity region positioned in the substrate. The second palm portion is positioned on the impurity region and contacting the impurity region.

In some embodiments, the semiconductor device includes an impurity region positioned in the substrate. The first palm portion is electrically coupled to the impurity region through a bottom conductive layer.

In some embodiments, the semiconductor device includes an impurity region positioned in the substrate. The second palm portion is electrically coupled to the impurity region through a bottom conductive layer.

In some embodiments, the semiconductor device includes a buried insulation layer positioned in the substrate. The impurity region is positioned above the buried insulation layer.

In some embodiments, a thickness of the first finger portion and a thickness of the second finger portion are different.

In some embodiments, a width of the first finger portion and a width of the second finger portion are different.

In some embodiments, a width of the first spacer and a width of the second spacer are different.

In some embodiments, a thickness of the bottom conductive layer and a thickness of the second finger portion are different.

Another aspect of the present disclosure provides a method for fabricating a semiconductor device including providing a substrate; sequentially forming a first conductive layer, an insulation layer, and a second conductive layer over the substrate to configure a stack; patterning the stack to form a first recess and expose an impurity region in the substrate; forming a first spacer to cover a sidewall of the first conductive layer; forming a first palm portion in the first recess and connecting to the second conductive layer; patterning the stack to form a third recess, turn the second conductive layer into a first finger portion, and turn the first conductive layer into a second finger portion, wherein the third recess is opposite to the first palm portion; forming a second spacer to cover a sidewall of the first finger portion, wherein the second spacer is opposite to the first palm portion; and forming a second palm portion in the third recess and connecting to the second finger portion.

In some embodiments, the method for fabricating the semiconductor device includes a step of forming a bottom conductive layer substantially in parallel with a main surface of the substrate and connecting to the first palm portion.

In some embodiments, the bottom conductive layer and the second finger portion include a same material.

Due to the design of the semiconductor device of the present disclosure, the contact area of the capacitor structure may be increased. As a result, the performance of the semiconductor device may be improved. In addition, the process flow may be easily integrated with fin type transistors.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
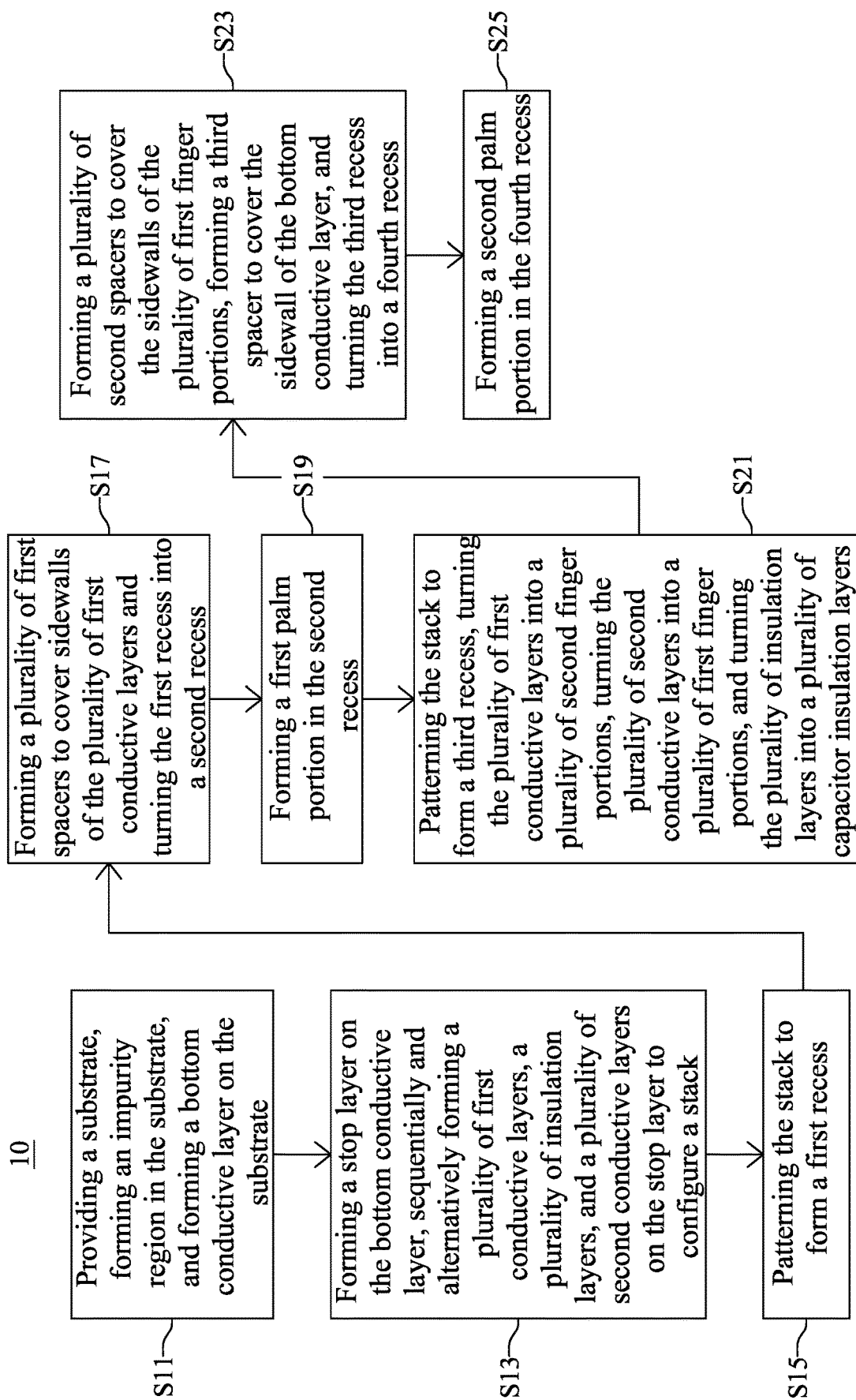
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 14 illustrate, in schematic cross-sectional view diagrams, a flow for fabricating the semiconductor device 1A in accordance with one embodiment of the present disclosure.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
FIGS. 2 to 14 illustrate, in schematic cross-sectional view diagrams, a flow for fabricating the semiconductor device in accordance with one embodiment of the present disclosure.
Figure 3:
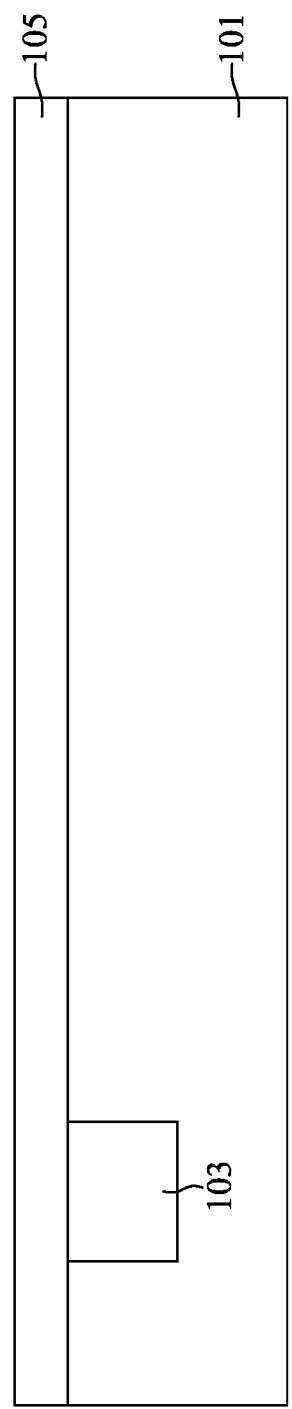

With reference to FIGS. 1 to 3, at step S11, a substrate 101 may be provided, an impurity region 103 may be formed in the substrate 101, and a bottom conductive layer 105 may be formed on the substrate 101.

With reference to FIG. 2, the substrate 101 may be a bulk semiconductor substrate, a multi-layered or gradient substrate, or the like. The substrate 101 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, or GaInAsP; or a combination thereof. The substrate 101 may be doped or undoped.

With reference to FIG. 2, the impurity region 103 may be formed in the substrate 101. The top surface of the impurity region 103 may be substantially coplanar with the top surface of the substrate 101. A photoresist layer may be formed over the substrate 101. The photoresist layer may be patterned to expose the area where the impurity region 103 to be formed. The photoresist layer may be formed by using a spin-on technique and may be patterned using acceptable photolithography techniques. Once the photoresist layer is patterned, an n-type impurity or a p-type impurity implantation process may be performed, and the photoresist layer may act as a mask to substantially prevent impurities from being implanted into the covered area. After the implantation process, the photoresist layer may be removed, such as by an acceptable ashing process.

The n-type impurity implantation process may add impurities that contribute free electrons to an intrinsic semiconductor. In a silicon-containing substrate, examples of n-type dopants, i.e., impurities, include but are not limited to antimony, arsenic, or phosphorous. The p-type impurity implantation process may add impurities to an intrinsic semiconductor that creates deficiencies of valence electrons. In a silicon-containing substrate, examples of p-type dopants, i.e., impurities include but are not limited to boron, aluminum, gallium, or indium. The dopant concentration of the impurity region 103 may be between about 1E17 atoms/cm^3 and between about 1E18 atoms/cm^3.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the bottom conductive layer 105 may be blanket deposited on the substrate 101 and may be electrically connected to the impurity region 103 by contacting the impurity region 103. It should be noted that, in the current stage, the bottom conductive layer 105 may cover the whole substrate 101 in a top-view perspective (not shown). In some embodiments, the bottom conductive layer 105 may be formed of, for example, polycrystalline silicon, polycrystalline germanium, polycrystalline silicon germanium, or the like. The bottom conductive layer 105 may be doped or undoped. For example, the bottom conductive layer 105 may be doped with n-type dopants or p-type dopants.

In some embodiments, the bottom conductive layer 105 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the bottom conductive layer 105 may be formed by, for example, chemical vapor deposition, plasma-enhanced chemical vapor deposition, sputtering, or other suitable deposition techniques.

Figure 4:
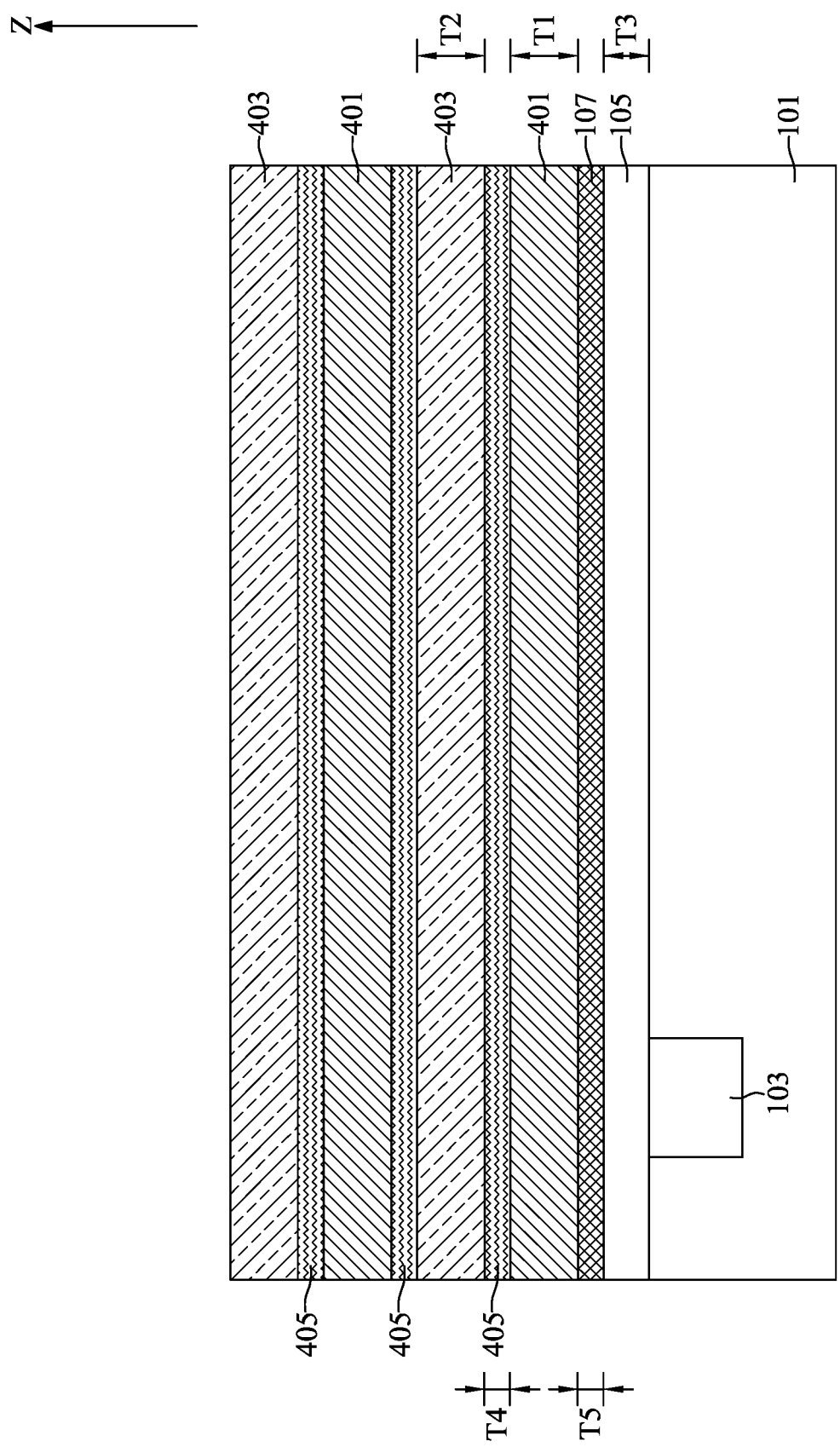

With reference to FIGS. 1 and 4, at step S13, a stop layer 107 may be formed on the bottom conductive layer 105, a plurality of first conductive layers 401, a plurality of insulation layers 405, and a plurality of second conductive layers 403 may be sequentially and alternatively formed on the stop layer 107 to configure a stack.

With reference to FIG. 4, the stop layer 107 may be blanket deposited on the bottom conductive layer 105. In some embodiments, the stop layer 107 may be formed of, for example, silicon oxide, silicon nitride, silicon oxynitride, silicon nitride oxide, or the like. In some embodiments, the stop layer 107 may be formed of, for example, a low-k material. The low-k material may have a dielectric constant less than 3.6. In some embodiments, the stop layer 107 may be formed of, for example, oxides, nitrides, oxynitrides, silicates (e.g., metal silicates), aluminates, titanates, nitrides, high-k materials, or any combination thereof. In some embodiments, the stop layer 107 may include multiple layers. For example, a layer of silicon oxide and a layer of high-k materials.

The high-k materials may have a dielectric constant greater than about 7.0 and may be a metal oxide or a silicate of Hf, Al, Zr, La, Mg, Ba, Ti, Pb, or a combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as, for example, lanthanum and aluminum.

In some embodiments, the stop layer 107 may be formed by atomic layer deposition, chemical vapor deposition, molecular-beam deposition, plasma-enhanced chemical vapor deposition, chemical solution deposition, the like, or a combination thereof. In some embodiments, the thickness of the stop layer 107 may vary depending on the deposition process as well as the composition and number of materials used.

With reference to FIG. 4, the plurality of first conductive layers 401, the plurality of insulation layers 405, and the plurality of second conductive layers 403 may be alternatively deposited. For brevity, clarity, and convenience of description, only one first conductive layer 401, one second conductive layer 403, and one insulation layer 405 are described. For example, the first conductive layer 401 may be blanket formed on the stop layer 107. The insulation layer 405 may be blanket formed on the first conductive layer 401. The second conductive layer 403 may be blanket formed on the insulation layer 405. Another insulation layer 405 may be blanket formed on the second conductive layer 403. Another first conductive layer 401 may be blanket formed on the other insulation layer 405. Another insulation layer 405 and another second conductive layer 403 may be sequentially formed on the other first conductive layer 401. Other first conductive layer 401, second conductive layer 403, and insulation layer 405 may be stacked with a similar manner.

It should be noted that the number of the first conductive layer 401, the second conductive layer 403, and the insulation layer 405 in FIG. 4 are just for illustration purpose. The number of the first conductive layer 401, the second conductive layer 403, and the insulation layer 405 may be more or less than that illustrated in the FIG. 4.

In some embodiments, the first conductive layer 401 and the second conductive layer 403 may be formed of, for example, a group IV material, such as Si, Ge, SiGe, SiGeSn, or the like, or a group III-group V compound material, such as GaAs, GaP, GaAsP, AlInAs, AlGaAs, GaInAs, InAs, GaInP, InP, InSb, GaInAsP, or the like. In some embodiments, the first conductive layer 401 and the second conductive layer 403 include silicon. In some embodiments, the first conductive layer 401 and the second conductive layer 403 include carbon doped silicon (Si:C). This Si:C layer can be grown in the same chamber used for other epitaxy steps or in a dedicated Si:C epitaxy chamber. The Si:C can include carbon in the range of 0.2 to 3.0%.

In some embodiments, the first conductive layer 401 and the second conductive layer 403 may be formed of different materials. The difference in materials may allow for the different strains for the first conductive layer 401 and the second conductive layer 403. For example, the first conductive layer 401 is a layer of $Si_{0.50}Ge_{0.50}$ and second conductive layer 403 is a layer of Si. The first conductive layer 401 may have natural lattice constant larger than that of the second conductive layer 403. Hence, the first conductive layer 401 may be compressively strained and the second conductive layer 403 may be tensilely strained. In some embodiments, the first conductive layer 401 and the bottom conductive layer 105 may be formed of a same material but is not limited thereto. In some embodiments, the second conductive layer 403 and the bottom conductive layer 105 may be formed of a same material but is not limited thereto.

In some embodiments, the first conductive layer 401 and the second conductive layer 403 may include epitaxial semiconductor materials grown from gaseous or liquid precursors. The first conductive layer 401 and the second conductive layer 403 may be formed by rapid thermal chemical vapor deposition, metal-organic chemical vapor deposition, molecular beam epitaxy, liquid phase epitaxy, vapor phase epitaxy, ultra-high-vacuum chemical vapor deposition, low-pressure chemical vapor deposition, limited reaction processing chemical vapor deposition, or the like. In some embodiments, first conductive layer 401 and the second conductive layer 403 may include a crystalline material.

In some embodiments, epitaxial silicon, SiGe, and/or carbon doped silicon (Si:C) may be doped during deposition (in-situ doped) by adding dopants, n-type dopants (e.g., phosphorus or arsenic) or p-type dopants (e.g., boron or gallium). The dopant concentration of the first conductive layer 401 and the second conductive layer 403 may be between about 1E19 $cm^{-3}$ to 2E21 $cm^{-3}$, or between 1E20 $cm^{-3}$ and 1E21 $cm^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and a combination thereof.

An epitaxial germanium layer may be deposited from a germanium gas source that is selected from the group consisting of germane, digermane, halogermane, dichlorogermane, trichlorogermane, tetrachlorogermane and a combination thereof.

An epitaxial silicon germanium alloy layer may be formed utilizing a combination of such gas sources. Carrier gases like hydrogen, nitrogen, helium and argon may be used.

In some embodiments, the first conductive layer 401 may be condensed using a thermal oxidation process, for example, that results in the Si in the SiGe layer (e.g., the first conductive layer 401) being consumed (by the oxidation process) while the Ge is driven down into the underlying layer. The thermal oxidation process may include, for example, exposing the initial SiGe layer to a temperature of from about 900° C. to about 1,200° C., e.g., about 1,100° C. for a duration from about 5 minutes to about 15 minutes, in $O_2$.

In some embodiments, the thickness T1 of the first conductive layer 401 may be less than the thickness T2 of the second conductive layer 403. In some embodiments, the first conductive layer 401 and the second conductive layer 403 may have thicknesses less than a critical thickness. In some embodiments, the second conductive layer 403 may have thicknesses in the range between about 6 nm and about 20 nm. The first conductive layer 401 may have thicknesses in the range between about 4 nm and about 10 nm. In some embodiments, the thickness T1 of the first conductive layer 401 may be greater than or equal to the thickness T2 of the second conductive layer 403. In some embodiments, the thickness T1 of the first conductive layer 401 may be greater than or equal to the thickness T3 of the bottom conductive layer 105. In some embodiments, the thickness T1 of the first conductive layer 401 may be less than the thickness T3 of the bottom conductive layer 105.

With reference to FIG. 4, the insulation layer 405 may be formed of, for example, silicon oxide, silicon nitride, silicon oxynitride, silicon nitride oxide, or the like. In some embodiments, the insulation layer 405 may be formed of, for example, a low-k material. In some embodiments, the insulation layer 405 may be formed of, for example, oxides, nitrides, oxynitrides, silicates (e.g., metal silicates), aluminates, titanates, nitrides, high-k materials, or any combination thereof. In some embodiments, the insulation layer 405 may include multiple layers. For example, a layer of silicon oxide and a layer of high-k materials. In some embodiments, the insulation layer 405 may be formed of a same material as the stop layer 107 but is not limited thereto.

The high-k materials may have a dielectric constant greater than about 7.0 and may be a metal oxide or a silicate of Hf, Al, Zr, La, Mg, Ba, Ti, Pb, or a combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as, for example, lanthanum and aluminum.

In some embodiments, the insulation layer 405 may be formed by atomic layer deposition, chemical vapor deposition, molecular-beam deposition, plasma-enhanced chemical vapor deposition, chemical solution deposition, the like, or a combination thereof. In some embodiments, the thickness T4 of the insulation layer 405 may be greater than or equal to the thickness T5 of the stop layer 107. In some embodiments, the thickness T4 of the insulation layer 405 may be less than the thickness T5 of the stop layer 107. In some embodiments, the thickness of the insulation layer 405 may vary depending on the deposition process as well as the composition and number of materials used.

The bottom conductive layer 105, the stop layer 107, the plurality of first conductive layers 401, the plurality of insulation layers 405, and the plurality of second conductive layers 403 together configure a stack.

Figure 5:
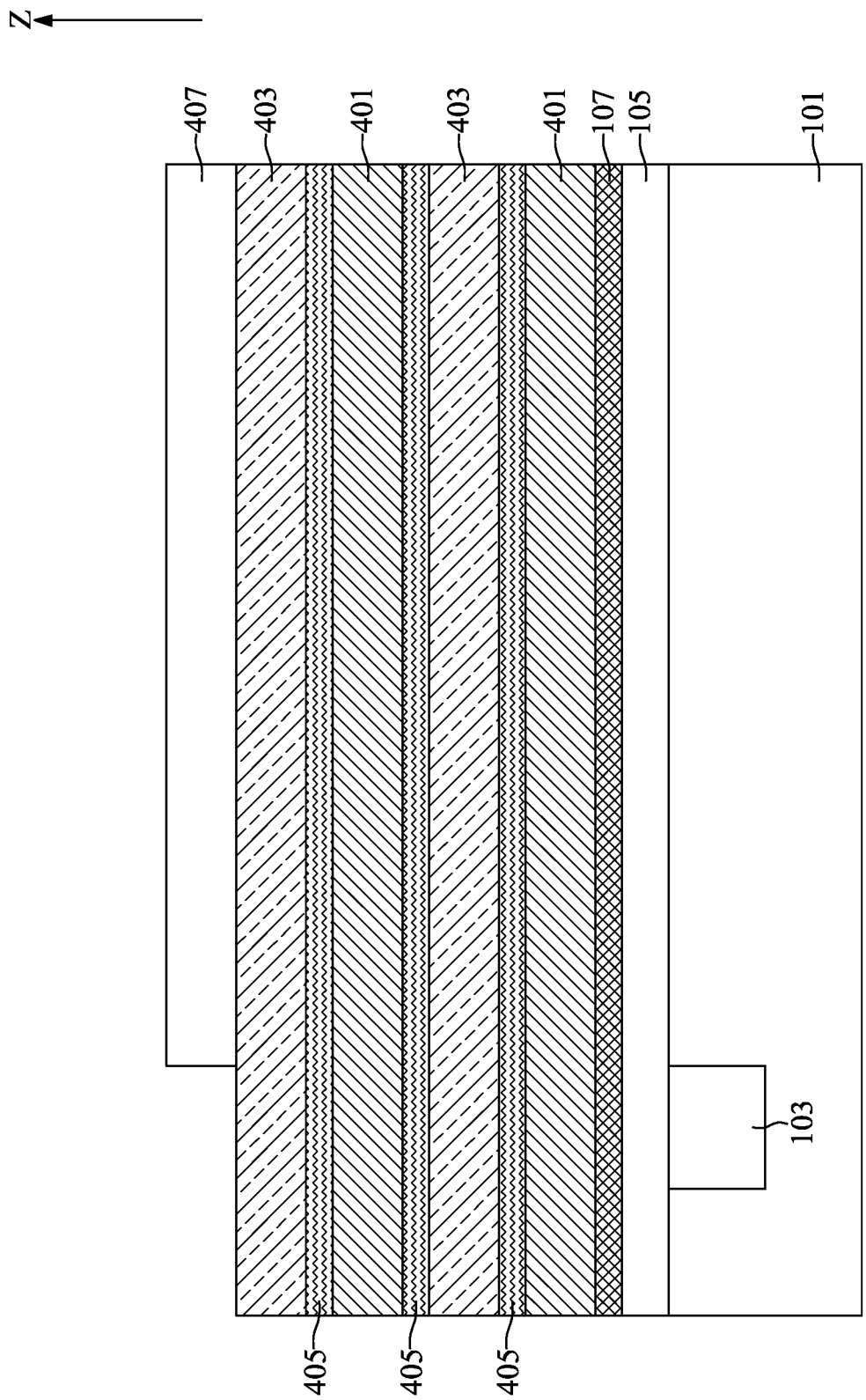
Figure 6:
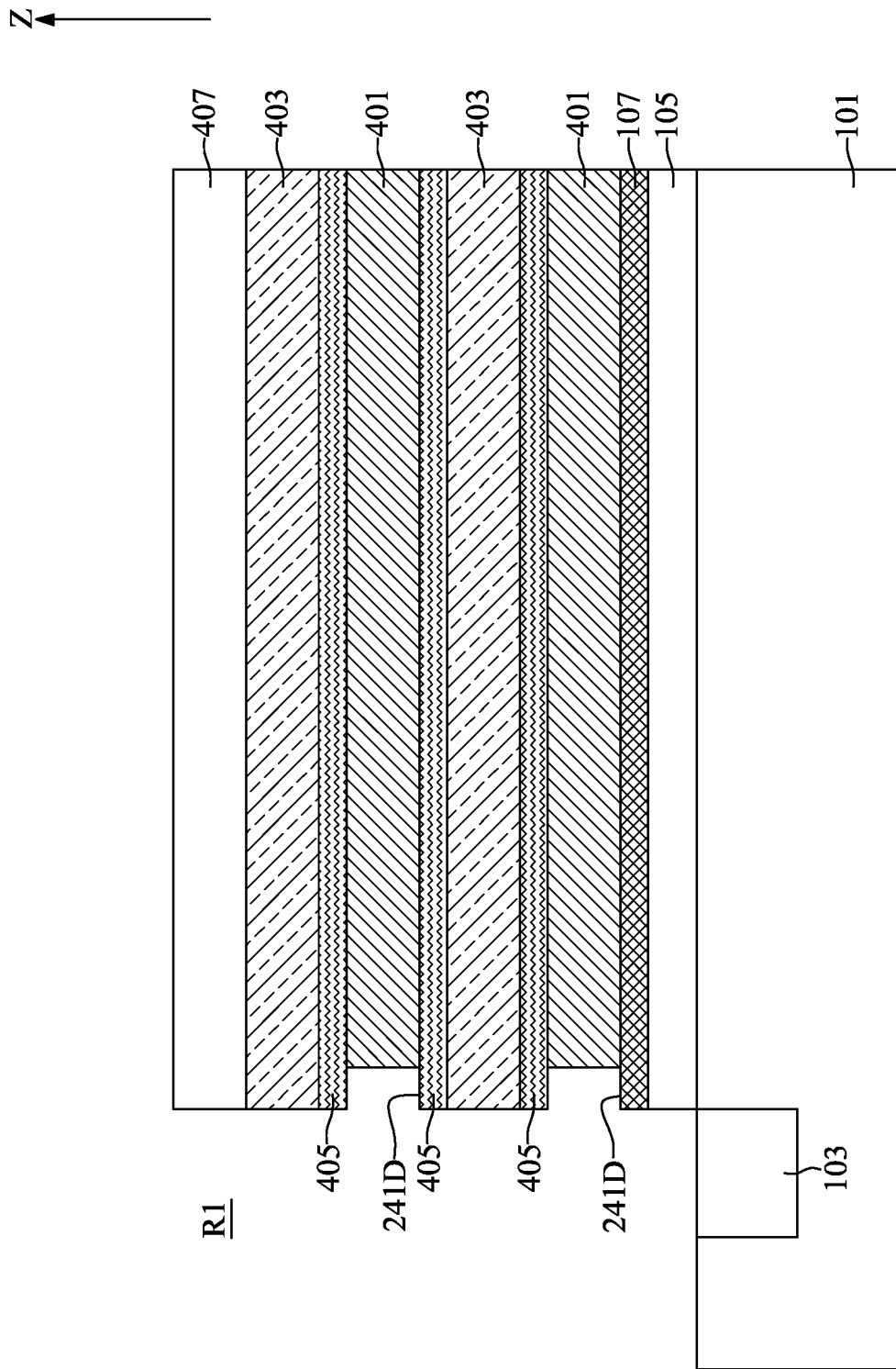

With reference to FIG. 1 and FIGS. 5 and 6, at step S15, the stack may be patterned to form a first recess R1.

With reference to FIG. 5, a first mask layer 407 may be formed on the topmost layer of the stack (i.e., the second conductive layer 403 in the present embodiment). The first mask layer 407 may be line shape in a top-view perspective (not shown). The first mask layer 407 may be, for example, a hard mask layer formed of a material having etching selectivity to the first conductive layer 401, the second conductive layer 403, the insulation layer 405, the stop layer 107, and the bottom conductive layer 105. In some embodiments, the first mask layer 407 may be formed of, for example, amorphous carbon, silicon borocarbonitride, silicon oxycarbonitride, or silicon oxycarbide.

With reference to FIG. 6, an etch process may be performed to the intermediate semiconductor device illustrated in FIG. 5 to form the first recess R1. The etch process may be, for example, a reactive ion etch, a neutral beam etch, the like, or a combination thereof. The etch process may be anisotropic. After the etch process, the sidewalls of the plurality of first conductive layers 401 and the plurality of second conductive layers 403 may be exposed through the first recess R1. In some embodiments, the etch process may be a timed isotropic wet etch process. In some embodiments, the etch process may be a selective dry etch process. In some embodiments, the etch process may be a combination of dry and wet etch processes.

In some embodiments, the etch rate of the first conductive layer 401 may be faster than the etch rate of the second conductive layer 403 during the etch process. After the etch process, the width of the plurality of first conductive layers 401 may be shorter than the width of the plurality of second conductive layers 403 and the plurality of insulation layers 405. The recesses adjacent to the plurality of first conductive layers 401 may be regarded as a plurality of dimples 241D. This plurality of dimples 241D may be the result of the plurality of first conductive layer 401 being etched laterally during the etch process.

Figure 7:
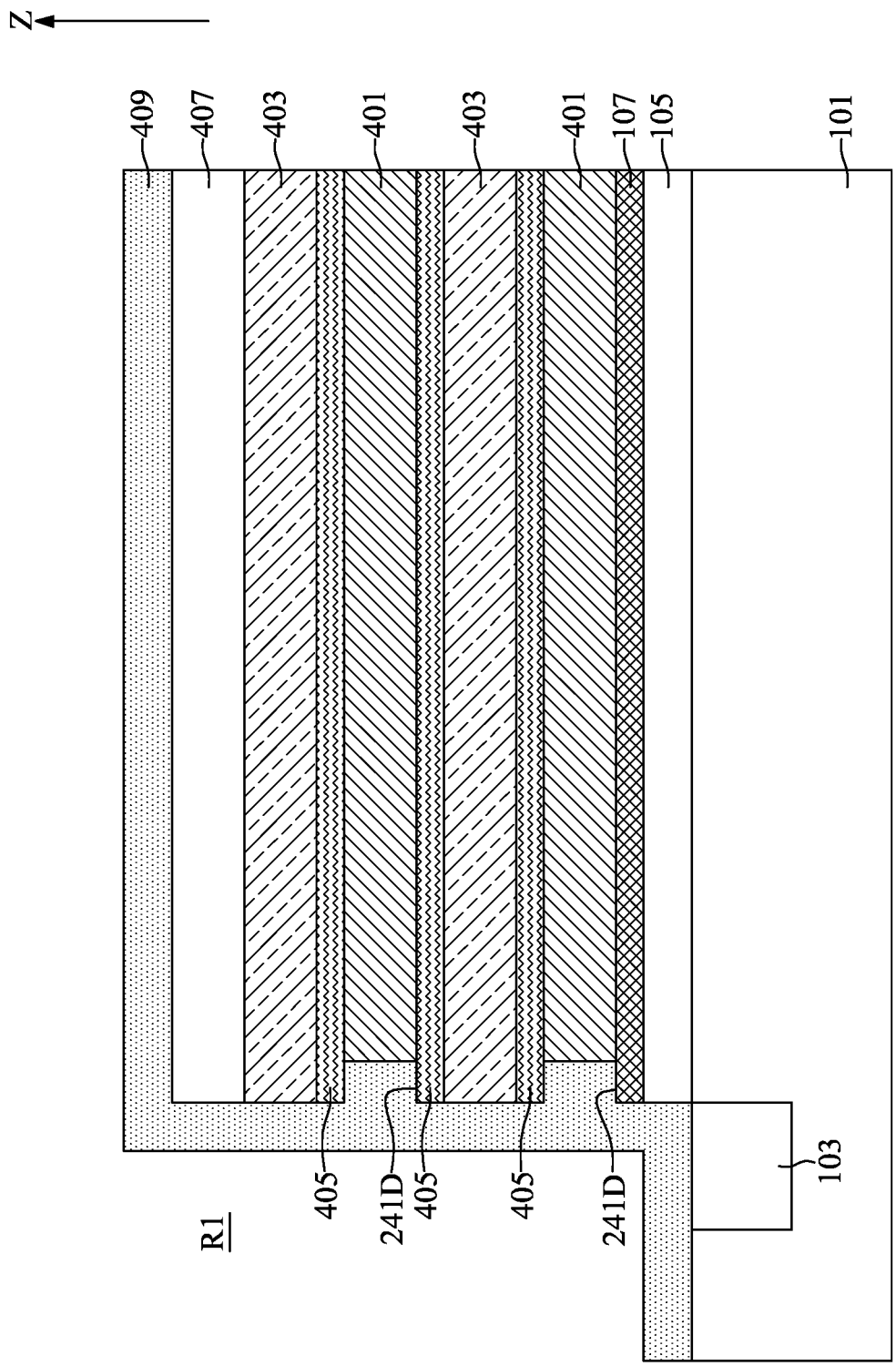
Figure 8:
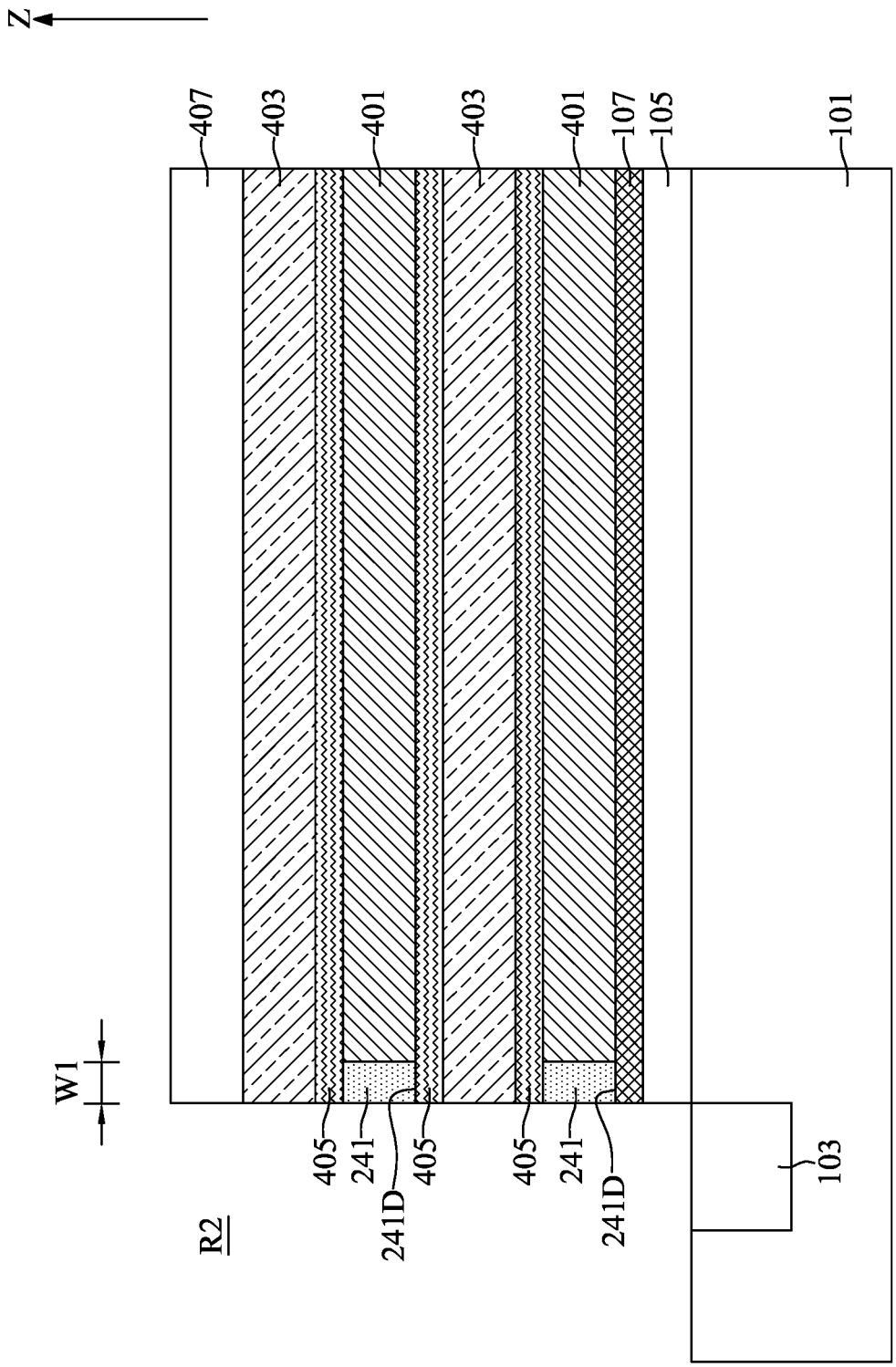

With reference to FIG. 1 and FIGS. 7 and 8, at step S17, a plurality of first spacers 241 may be formed to cover the sidewalls of the plurality of first conductive layers 401.

With reference to FIG. 7, a layer of first dielectric material 409 may be conformally formed to the intermediate semiconductor device illustrated in FIG. 7. The layer of first dielectric material 409 may completely fill the plurality of dimples 241D. In some embodiments, the first dielectric material 409 may be the same as the material of the stop layer 107 or the material of the insulation layer 405, but is not limited thereto. In some embodiments, the first dielectric material 409 may be for example, silicon oxide, silicon nitride, silicon oxynitride, silicon nitride oxide, or the like. In some embodiments, the first dielectric material 409 may be formed of, for example, a low-k material. In some embodiments, the first dielectric material 409 may be formed of, for example, oxides, nitrides, oxynitrides, silicates (e.g., metal silicates), aluminates, titanates, nitrides, high-k materials, or any combination thereof. The layer of first dielectric material 409 may be formed by, for example, atomic layer deposition, chemical vapor deposition, plasma-enhanced chemical vapor deposition.

With reference to FIG. 8, an etch process, such as an anisotropic dry etch process, may be performed to remove portions of the layer of first dielectric material 409. After the etch process, the first dielectric material 409 outside the plurality of dimples 241D may be removed. The first dielectric material 409 remained in the plurality of dimples 241D may be regarded as the plurality of first spacers 241. The first recess R1 may be turned into the second recess R2. The sidewalls of the plurality of second conductive layers 403 may be exposed through the second recess R2. In contrast, the sidewalls of the plurality of first conductive layers 401 may be covered by the plurality of first spacers 241 and may not exposed through the second recess R2. After the etch process, the first mask layer 407 may be removed.

In some embodiments, before the etch process, the first dielectric material 409 deposited outside the plurality of dimples 241D may be transformed into a transformed dielectric material (not shown). In an embodiment, transformed dielectric material may have a different etch selectivity than the first dielectric material 409. By altering the etch selectivity of the transformed dielectric material as compared to the first dielectric material 409, the etch process to remove excess first dielectric material 409 from outside the plurality of dimples 241D may be more easily controlled. In such situation, the etch process may be an isotropic etch process. Transformation may occur by plasma treatment, implantation, oxidation, or a combination thereof. The transformation process is sufficient to alter the etch selectivity of the first dielectric material 409 outside of the plurality of dimples 241D, but does not affect mobility or degrade performance of the plurality of first conductive layers 401 and the plurality of second conductive layers 403.

In some embodiments, the plurality of first conductive layers 401 may not be laterally etched during the etch process. In other words, the sidewall of the stack may be substantially vertical. Alternatively, a selective oxidation process may be performed to selectively form the plurality of first spacers 241 on the sidewalls of the plurality of first conductive layers 401. The selective oxidation process may be a selective wet oxidation or selective dry oxidation. If a selective wet oxidation process is desired, a high-pressure steam oxidation process may be performed. The high-pressure steam oxidation may include performing the oxidation above an atmospheric pressure in a combined $H_2O$/N-based environment at relatively low temperatures ranging, for example, from about 500° C. to about 700° C. If a selective dry oxidation process is desired, a oxidation may be performed at atmospheric pressure, e.g., approximately 10,1325 pascals (Pa) (e.g., in an $O_2$ or $O_2/N_2$ based environment at temperatures ranging, for example, from about 600° C. to about 800° C. The selective oxidation process may be time-based such that the plurality of first spacers 241 having a desired width may be achieved. The width W1 of the plurality of first spacers 241 may be between about 5 nm and about 7 nm. Additional etch processes may be performed to remove excess oxidation material from sidewalls of the plurality of first conductive layers 401.

Figure 9:
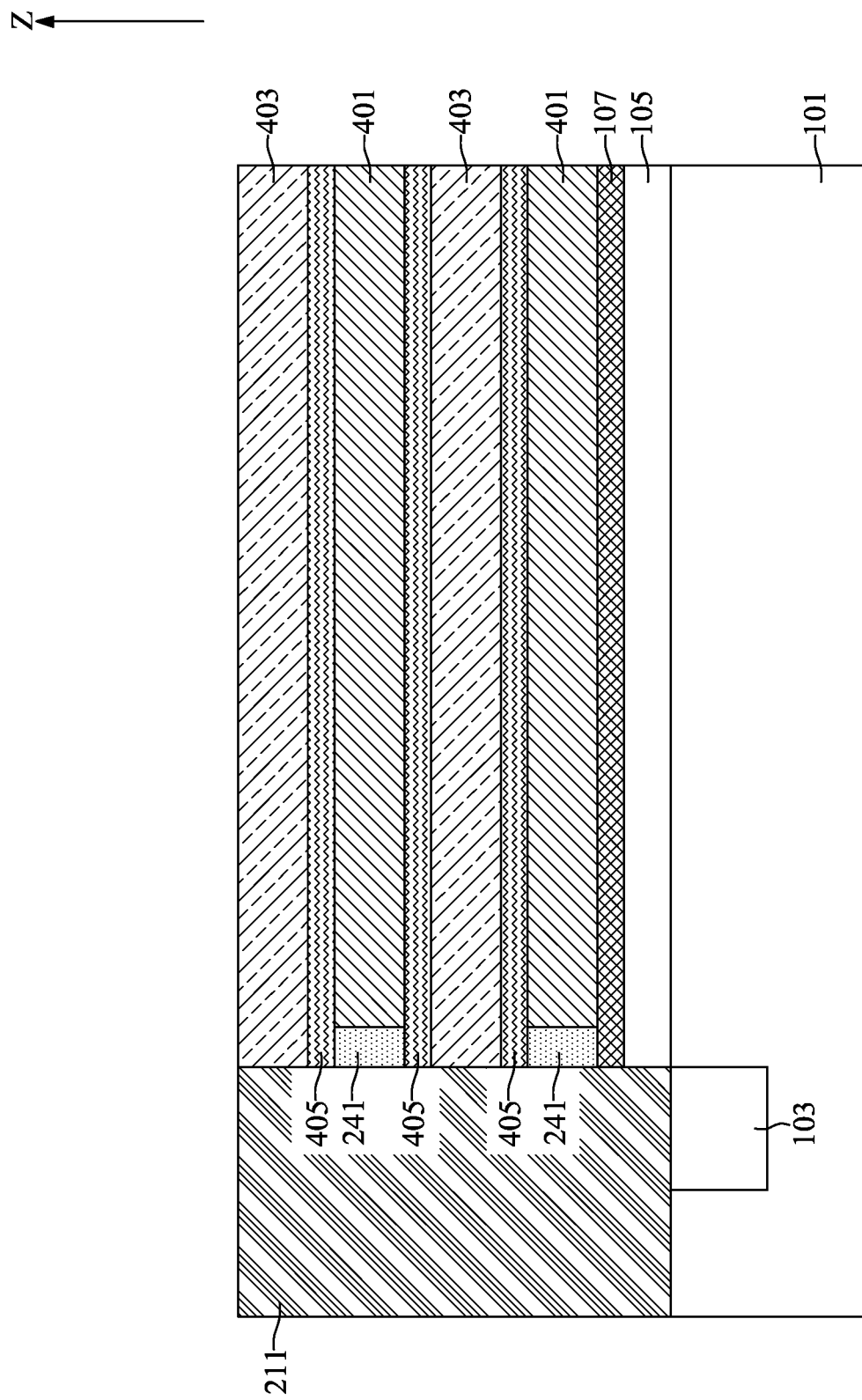

With reference to FIGS. 1 and 9, at step S19, a first palm portion 211 may be formed in the second recess R2.

With reference to FIG. 9, the first palm portion 211 may be formed to fill the second recess R2 and electrically connect to the plurality of second conductive layers 403 and the bottom conductive layer 105. In some embodiments, the first palm portion 211 may be formed on the impurity region 103 and electrically connected to the impurity region 103. In some embodiments, the first palm portion 211 may be formed of a same material as the plurality of second conductive layers 403 or the plurality of first conductive layers 401. In some embodiments, the first palm portion 211 may be formed of a different material from the plurality of second conductive layers 403 or the plurality of first conductive layers 401.

In some embodiments, the first palm portion 211 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the first palm portion 211 may be formed by, for example, chemical vapor deposition, plasma-enhanced chemical vapor deposition, sputtering, or other suitable deposition techniques.

In some embodiments, the first palm portion 211 may be formed for example, a group IV material, such as Si, Ge, SiGe, SiGeSn, or the like, or a group III-group V compound material, such as GaAs, GaP, GaAsP, AlInAs, AlGaAs, GaInAs, InAs, GaInP, InP, InSb, GaInAsP, or the like. The first palm portion 211 may be formed by rapid thermal chemical vapor deposition, metal-organic chemical vapor deposition, molecular beam epitaxy, liquid phase epitaxy, vapor phase epitaxy, ultra-high-vacuum chemical vapor deposition, low-pressure chemical vapor deposition, limited reaction processing chemical vapor deposition, or the like. The first palm portion 211 may be doped by n-type dopants or p-type dopants.

With reference to FIG. 9, a planarization process, such as chemical mechanical polishing, may be performed to remove excess material and provide a substantially flat surface for subsequent processing steps.

Figure 10:
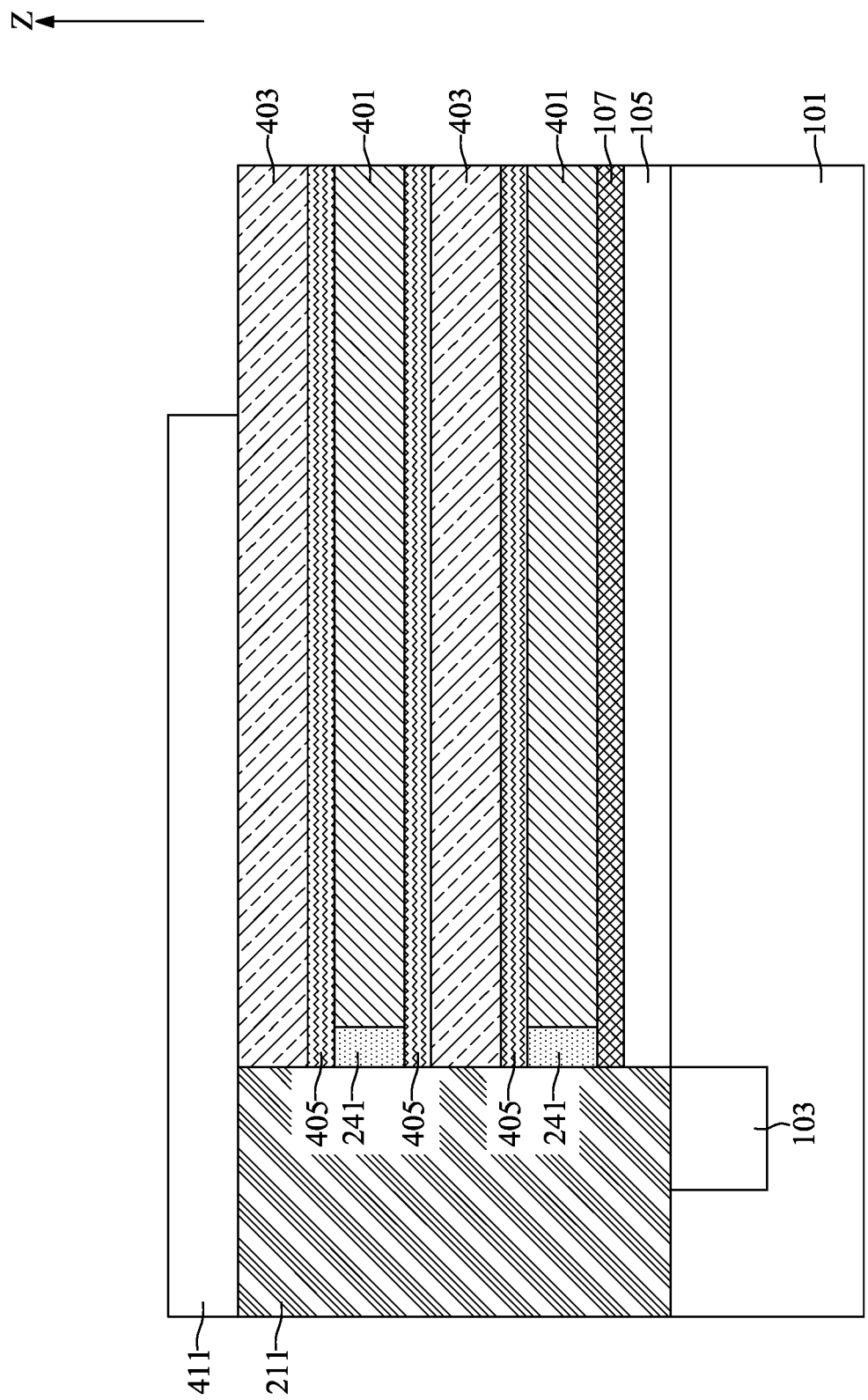
Figure 11:
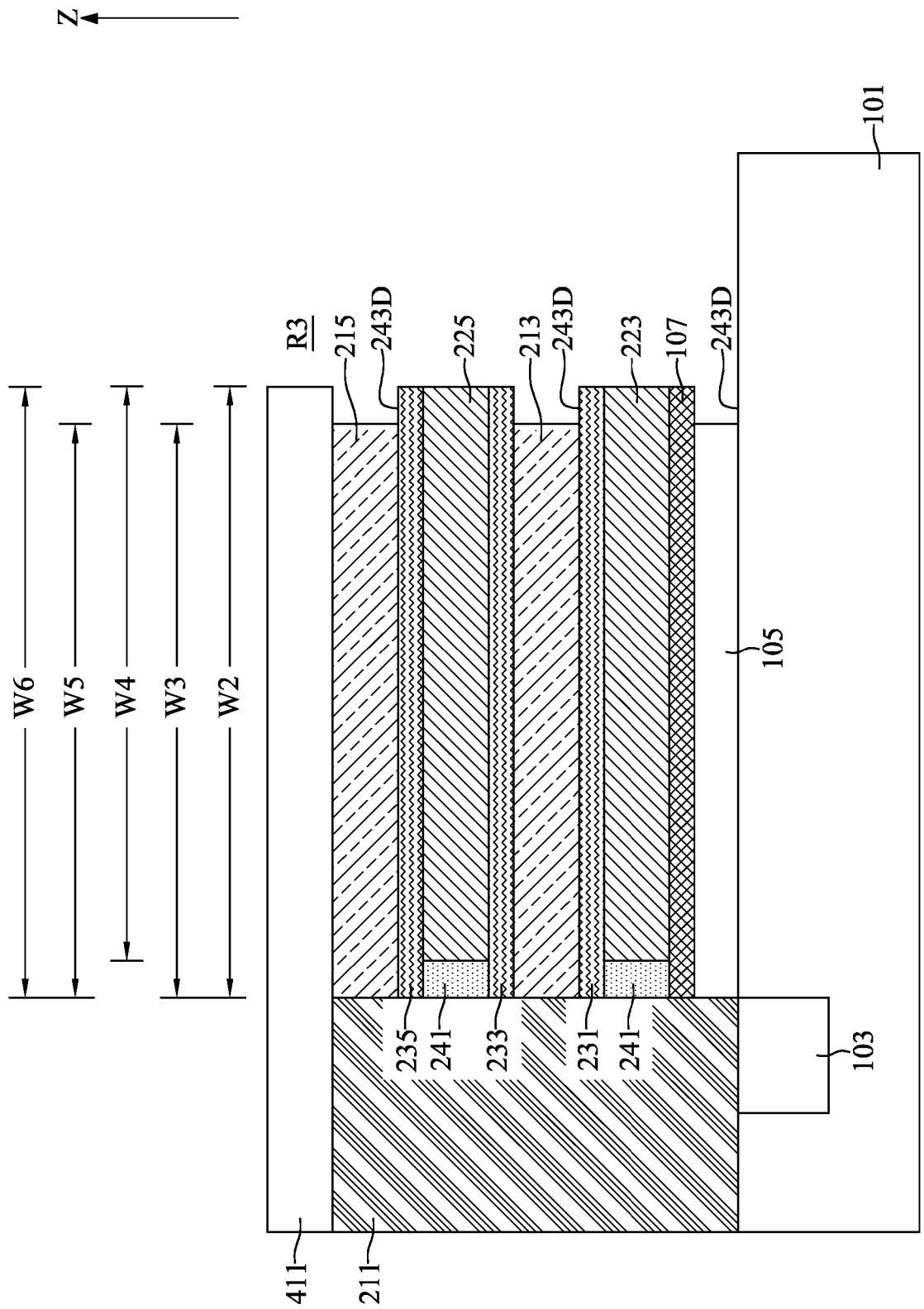

With reference to FIGS. 1, 10, and 11, at step S21, the stack may be patterned to form a third recess R3, the plurality of first conductive layers 401 may be turned into a plurality of second finger portions 223, 225, the plurality of second conductive layers 403 may be turned into a plurality of first finger portions 213, 215, and the plurality of insulation layers 405 may be turned into the plurality of capacitor insulation layers 231, 233, 235.

With reference to FIG. 10, a second mask layer 411 may be formed on the topmost layer of the stack and may cover the first palm portion 211. The second mask layer 411 may be line in a top-view perspective (not shown). The second mask layer 411 may be, for example, a hard mask layer formed of a material having etching selectivity to the first conductive layer 401, the second conductive layer 403, the insulation layer 405, the stop layer 107, and the bottom conductive layer 105. In some embodiments, the second mask layer 411 may be formed of, for example, amorphous carbon, silicon borocarbonitride, silicon oxycarbonitride, or silicon oxycarbide.

With reference to FIG. 11, an etch process may be performed to the intermediate semiconductor device illustrated in FIG. 10 to form the third recess R3. The etch process may be, for example, a reactive ion etch, a neutral beam etch, the like, or a combination thereof. The etch process may be anisotropic. The third recess R3 may be opposite to the first palm portion 211 with the stack interposed therebetween. After the etch process, the sidewalls of the plurality of first conductive layers 401 and the plurality of second conductive layers 403 may be exposed through the third recess R3. In some embodiments, the etch process may be a timed isotropic wet etch process. In some embodiments, the etch process may be a selective dry etch process. In some embodiments, the etch process may be a combination of dry and wet etch processes.

In some embodiments, the etch rate of the second conductive layer 403 may be faster than the etch rate of the first conductive layer 401 during the etch process. After the etch process, a plurality of recesses maybe formed adjacent to the plurality of second conductive layers 403 and may be regarded as a plurality of dimples 243D. This plurality of dimples 243D may be the result of the plurality of second conductive layers 403 being etched laterally during the etch process.

After the etch process, the plurality of first conductive layers 401 may be turned into a plurality of second finger portions 223, 225. The plurality of second conductive layers 403 may be turned into a plurality of first finger portions 213, 215. The plurality of insulation layers 405 may be turned into the plurality of capacitor insulation layers 231, 233, 235.

In some embodiments, the width W2 of the plurality of capacitor insulation layers 231, 233, 235 may be greater than the width W3 of the plurality of first finger portions 213, 215 or the width W4 of the plurality of second finger portions 223, 225. In some embodiments, the width W3 of the plurality of first finger portions 213, 215 may be greater than or equal to the width W4 of the plurality of second finger portions 223, 225. In some embodiments, the width W3 of the plurality of first finger portions 213, 215 may be less than the width W4 of the plurality of second finger portions 223, 225. In some embodiments, the width W3 of the plurality of first finger portions 213, 215 may be equal to the width W5 of the bottom conductive layer 105 but is not limited thereto. In some embodiments, the width W2 of the plurality of capacitor insulation layers 231, 233, 235 may be equal to the width W6 of the stop layer 107 but is not limited thereto.

Figure 12:
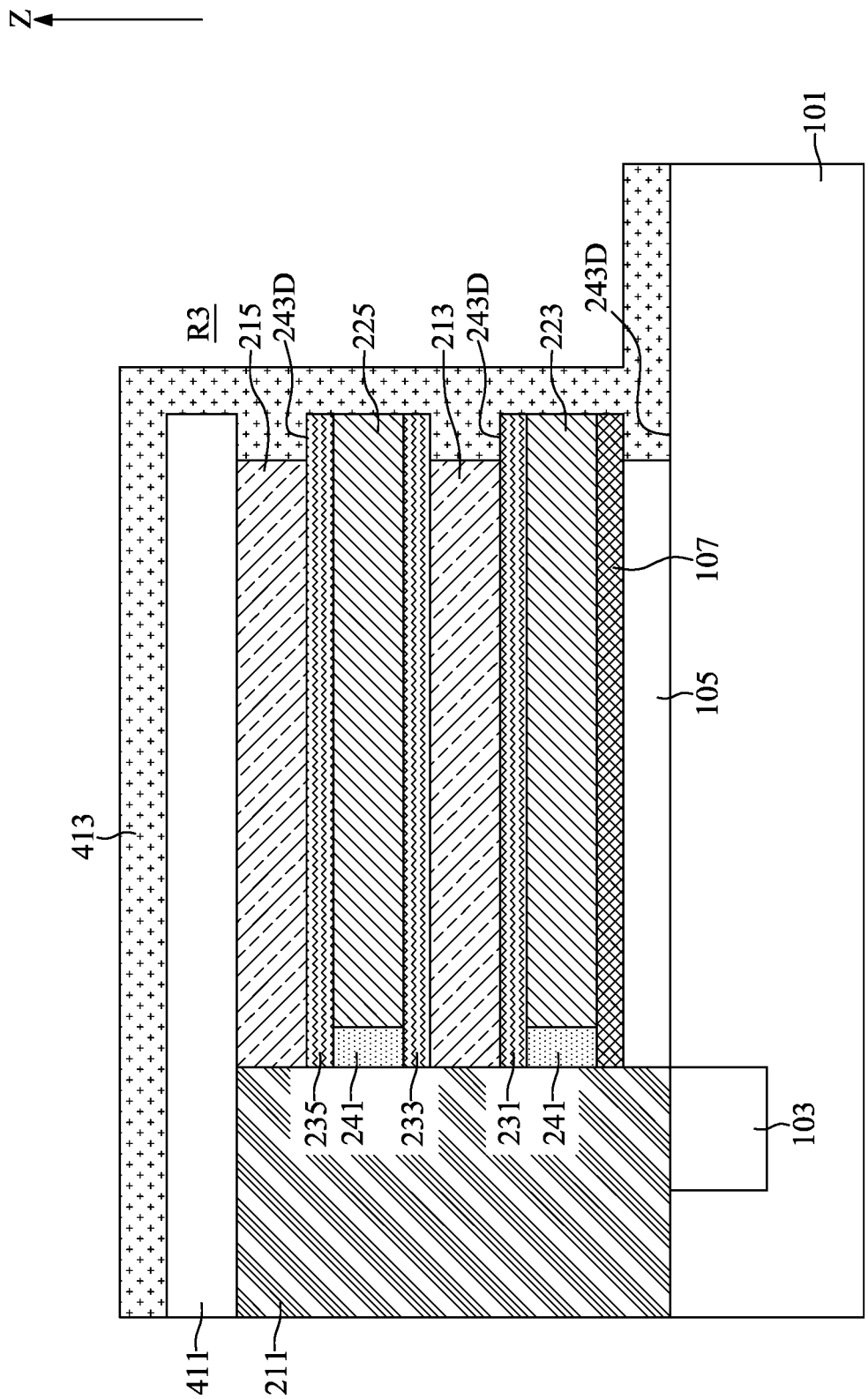
Figure 13:
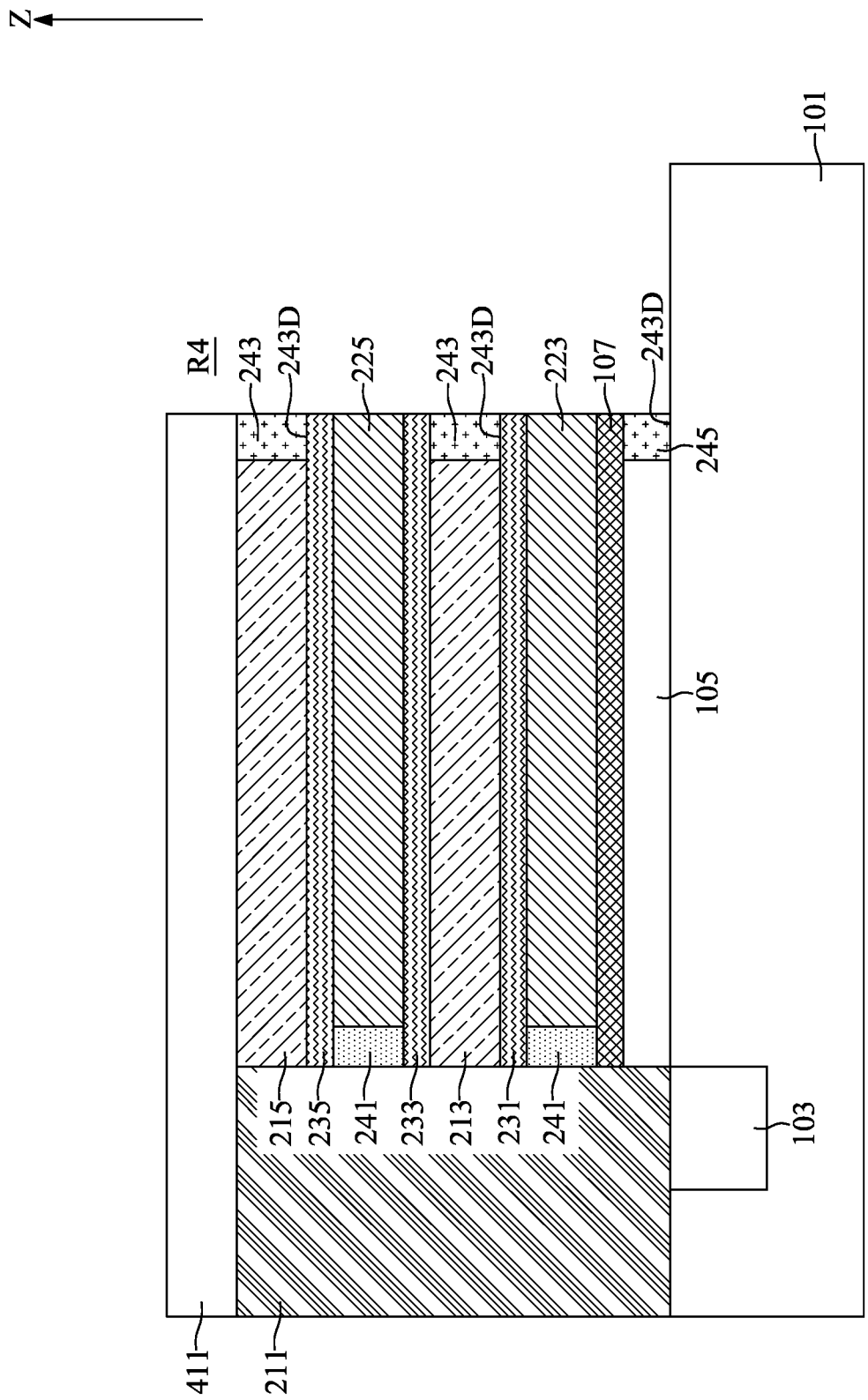

With reference to FIGS. 1, 12, and 13, at step S23, a plurality of second spacers 243 may be formed to cover the sidewalls of the plurality of first finger portions 213, 215 and a third spacer 245 may be formed to cover the sidewall of the bottom conductive layer 105.

With reference to FIG. 12, a layer of second dielectric material 413 may be conformally formed to the intermediate semiconductor device illustrated in FIG. 11. The layer of second dielectric material 413 may completely fill the plurality of dimples 243D. In some embodiments, the second dielectric material 413 may be the same as the material of the stop layer 107, the first dielectric material 409, or the material of the insulation layer 405, but is not limited thereto. In some embodiments, the second dielectric material 413 may be for example, silicon oxide, silicon nitride, silicon oxynitride, silicon nitride oxide, or the like. In some embodiments, the second dielectric material 413 may be formed of, for example, a low-k material. In some embodiments, the second dielectric material 413 may be formed of, for example, oxides, nitrides, oxynitrides, silicates (e.g., metal silicates), aluminates, titanates, nitrides, high-k materials, or any combination thereof. The layer of second dielectric material 413 may be formed by, for example, atomic layer deposition, chemical vapor deposition, plasma-enhanced chemical vapor deposition.

With reference to FIG. 13, an etch process, such as an anisotropic dry etch process, may be performed to remove portions of the layer of second dielectric material 413. After the etch process, the second dielectric material 413 outside the plurality of dimples 243D may be removed. The second dielectric material 413 remained in the plurality of dimples 243D may be regarded as the plurality of second spacers 243 and the third spacer 245. The third recess R3 may be turned into the fourth recess R4. The plurality of second spacers 243 and the third spacer 245 may be opposite to the first palm portion 211. The sidewalls of the plurality of second finger portions 223, 225 may be exposed through the fourth recess R4. In contrast, the sidewalls of the plurality of first finger portions 213, 215 may be covered by the plurality of second spacers 243 and the sidewall of the bottom conductive layer 105 may be covered by the third spacer 245. After the etch process, the second mask layer 411 may be removed.

In some embodiments, before the etch process, the second dielectric material 413 deposited outside the plurality of dimples 243D may be transformed into a transformed dielectric material (not shown). In an embodiment, transformed dielectric material may have a different etch selectivity than the second dielectric material 413. By altering the etch selectivity of the transformed dielectric material as compared to the second dielectric material 413, the etch process to remove excess second dielectric material 413 from outside the plurality of dimples 243D may be more easily controlled. In such situation, the etch process may be an isotropic etch process. Transformation may occur by plasma treatment, implantation, oxidation, or a combination thereof. The transformation process is sufficient to alter the etch selectivity of the second dielectric material 413 outside of the plurality of dimples 243D, but does not affect mobility or degrade performance of the plurality of first finger portions 213, 215 and the plurality of second finger portions 223, 225.

In some embodiments, the layer of second dielectric material 413 may not be laterally etched during the etch process. In other words, the sidewall of the stack may be substantially vertical. Alternatively, a selective oxidation process may be performed to selectively form the plurality of second spacers 243 on the sidewalls of the plurality of first finger portions 213, 215 and the third spacer 245 on the sidewall of the bottom conductive layer 105. The selective oxidation process may be a selective wet oxidation or selective dry oxidation. If a selective wet oxidation process is desired, a high-pressure steam oxidation process may be performed. The high-pressure steam oxidation may include performing the oxidation above an atmospheric pressure in a combined $H_2O/N$-based environment at relatively low temperatures ranging, for example, from about 500° C. to about 700° C. If a selective dry oxidation process is desired, a oxidation may be performed at atmospheric pressure, e.g., approximately 10,1325 pascals (Pa) (e.g., in an $O_2$ or $O_2/N_2$ based environment at temperatures ranging, for example, from about 600° C. to about 800° C. The selective oxidation process may be time-based such that the plurality of second spacers 243 or the third spacer 245 having a desired width may be achieved. Additional etch processes may be performed to remove excess oxidation material from sidewalls of the plurality of first finger portions 213, 215.

In some embodiments, the width W7 of the plurality of second spacers 243 may be larger than or equal to the width W1 of the plurality of first spacers 241. In some embodiments, the width W7 of the plurality of second spacers 243 may be less than the width W1 of the plurality of first spacers 241. In some embodiments, the width W7 of the plurality of second spacers 243 may be between about 5 nm and about 7 nm.

Figure 14:
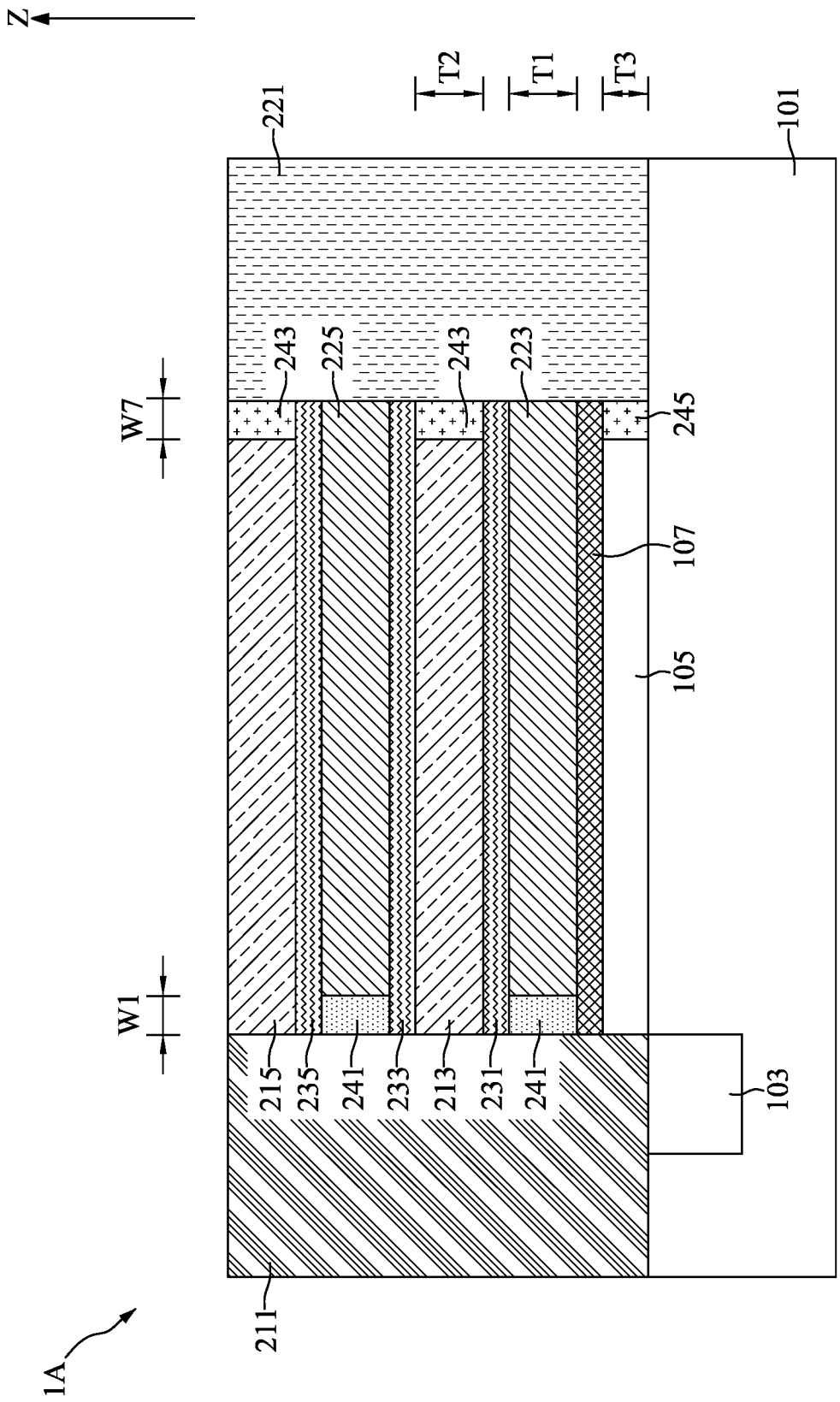

With reference to FIGS. 1 and 14, at step S25, a second palm portion 221 may be formed in the fourth recess R4.

With reference to FIG. 14, the second palm portion 221 may be formed to fill the fourth recess R4 and electrically connect to the plurality of second finger portions 223, 225. The second palm portion 221 may be electrically insulated from the plurality of first finger portions 213, 215 and the bottom conductive layer 105 by the plurality of second spacers 243 and the third spacer 245. In some embodiments, the second palm portion 221 may be formed of a same material as the plurality of second finger portions 223, 225 or the plurality of first finger portions 213, 215. In some embodiments, the second palm portion 221 may be formed of a different material from the plurality of second finger portions 223, 225 or the plurality of first finger portions 213, 215. In some embodiments, the second palm portion 221 may be formed of a same material as the first palm portion 211 but is not limited thereto. In some embodiments, the second palm portion 221 and the first palm portion 211 may have a same electrical type such as n-type or p-type.

In some embodiments, the second palm portion 221 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the second palm portion 221 may be formed by, for example, chemical vapor deposition, plasma-enhanced chemical vapor deposition, sputtering, or other suitable deposition techniques.

In some embodiments, the second palm portion 221 may be formed for example, a group IV material, such as Si, Ge, SiGe, SiGeSn, or the like, or a group III-group V compound material, such as GaAs, GaP, GaAsP, AlInAs, AlGaAs, GaInAs, InAs, GaInP, InP, InSb, GaInAsP, or the like. The second palm portion 221 may be formed by rapid thermal chemical vapor deposition, metal-organic chemical vapor deposition, molecular beam epitaxy, liquid phase epitaxy, vapor phase epitaxy, ultra-high-vacuum chemical vapor deposition, low-pressure chemical vapor deposition, limited reaction processing chemical vapor deposition, or the like. The second palm portion 221 may be doped by n-type dopants or p-type dopants.

With reference to FIG. 14, a planarization process, such as chemical mechanical polishing, may be performed to remove excess material and provide a substantially flat surface for subsequent processing steps.

With reference to FIG. 14, the first palm portion 211 and the plurality of first finger portions 213, 215 together configure a bottom electrode. The second palm portion 221 and the plurality of second finger portions 223, 225 together configure a top electrode. The plurality of capacitor insulation layers 231, 233, 235, the plurality of first spacers 241, the plurality of second spacers 243, and the third spacer 245 may electrically insulate the bottom electrode and the top electrode. The top electrode, the bottom electrode, and the plurality of capacitor insulation layers 231, 233, 235 together configure a capacitor structure. In some embodiments, the bottom electrode may further include the bottom conductive layer 105. The bottom conductive layer 105 may be electrically insulated from the second finger portion 223 by the stop layer 107.

FIGS. 15 to 18 illustrate, in schematic cross-sectional view diagrams, semiconductor devices 1B, 1C, 1D, and 1E in accordance with some embodiments of the present disclosure.

Figure 15:
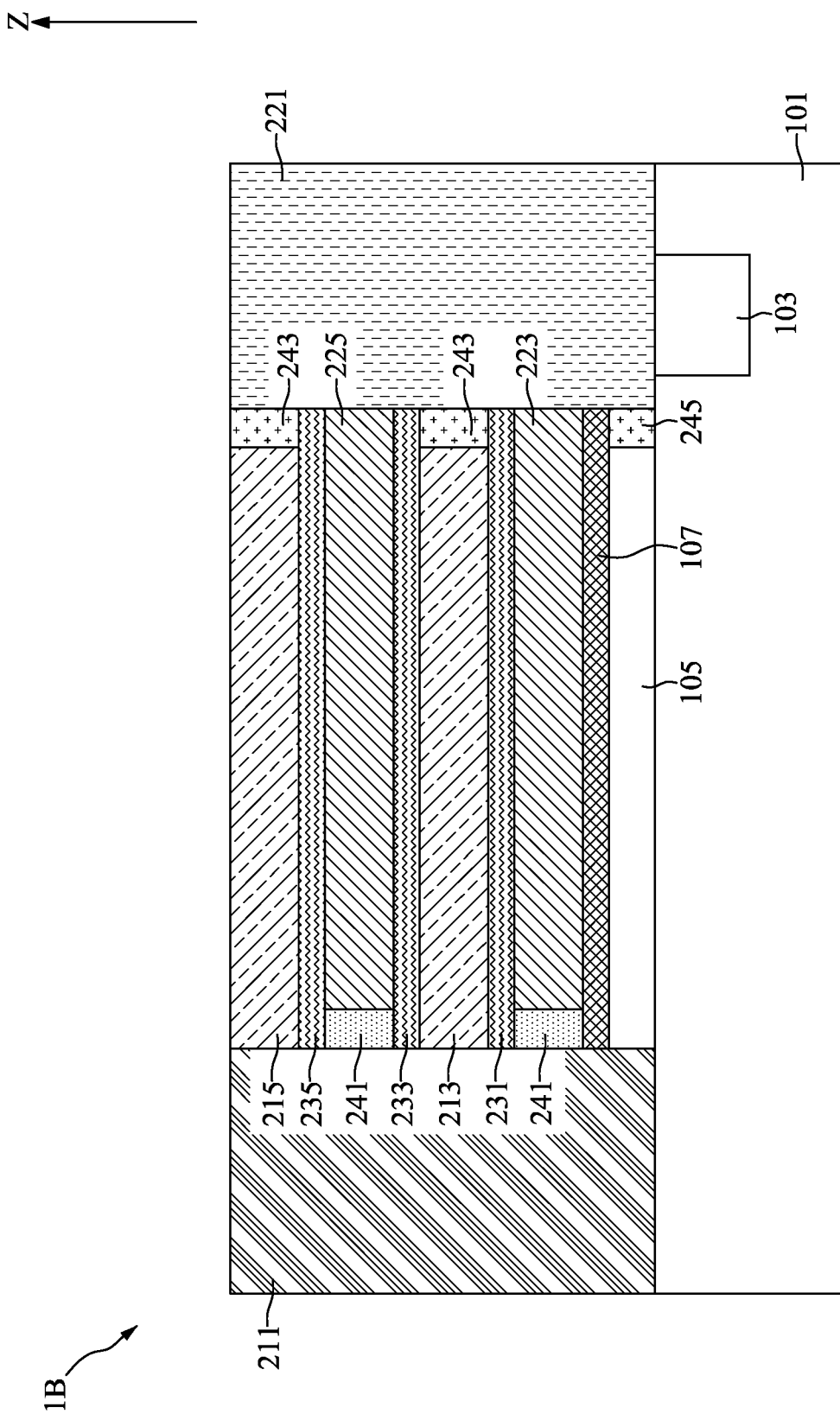
FIGS. 15 to 18 illustrate, in schematic cross-sectional view diagrams, semiconductor devices in accordance with some embodiments of the present disclosure.

With reference to FIG. 15, the semiconductor device 1B may have a structure similar to that illustrated in FIG. 14. The same or similar elements in FIG. 15 as in FIG. 14 have been marked with similar reference numbers and duplicative descriptions have been omitted. In the semiconductor device 1B, the impurity region 103 may be disposed under the second palm portion 221 and contacting the second palm portion 221.

Figure 16:
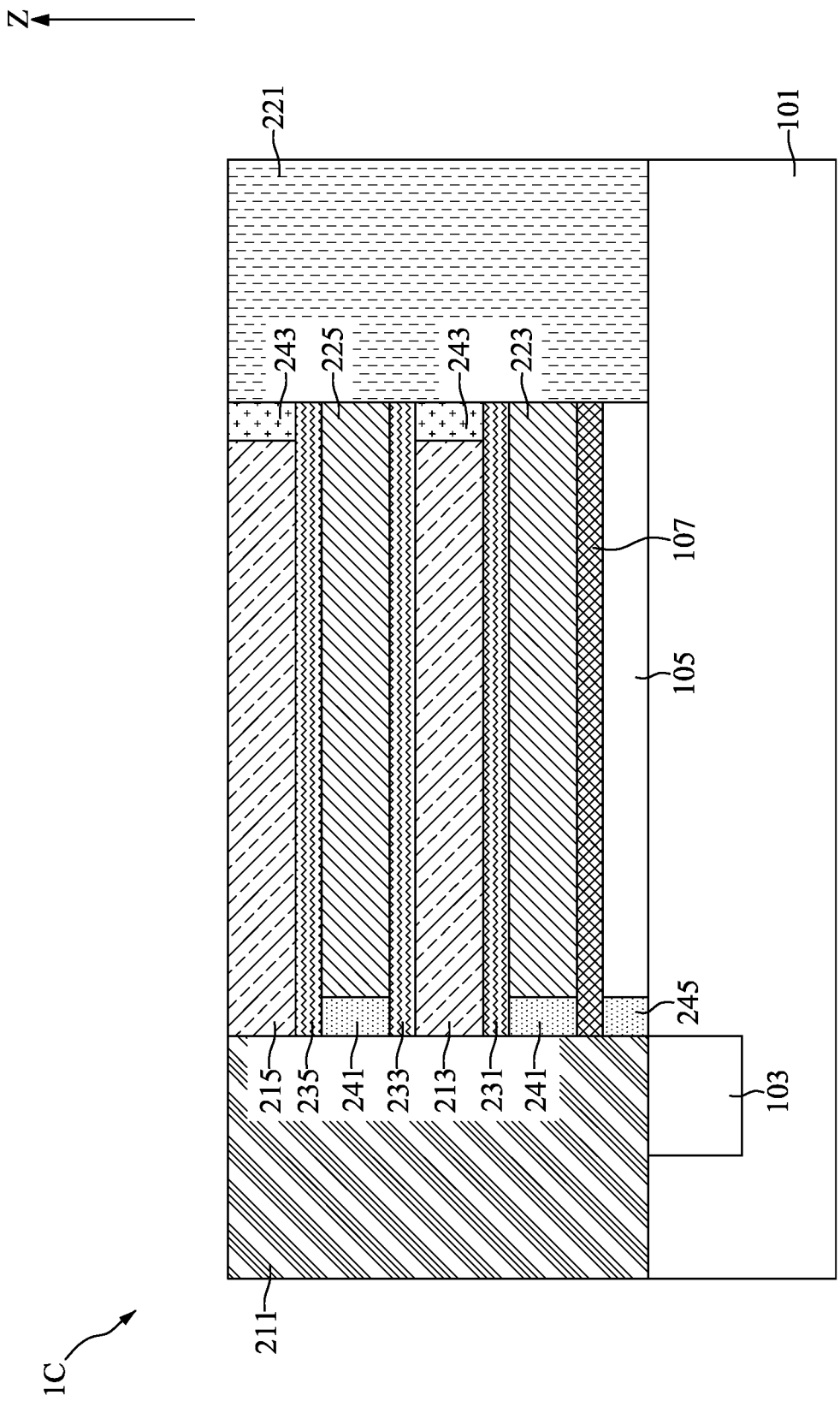

With reference to FIG. 16, the semiconductor device 1C may have a structure similar to that illustrated in FIG. 14. The same or similar elements in FIG. 16 as in FIG. 14 have been marked with similar reference numbers and duplicative descriptions have been omitted. In the semiconductor device 1C, the third spacer 245 may be disposed between the bottom conductive layer 105 and the first palm portion 211 to electrically insulate the bottom conductive layer 105 and the first palm portion 211. The second palm portion 221 may be contacting the bottom conductive layer 105 and electrically connected to the bottom conductive layer 105.

Figure 17:
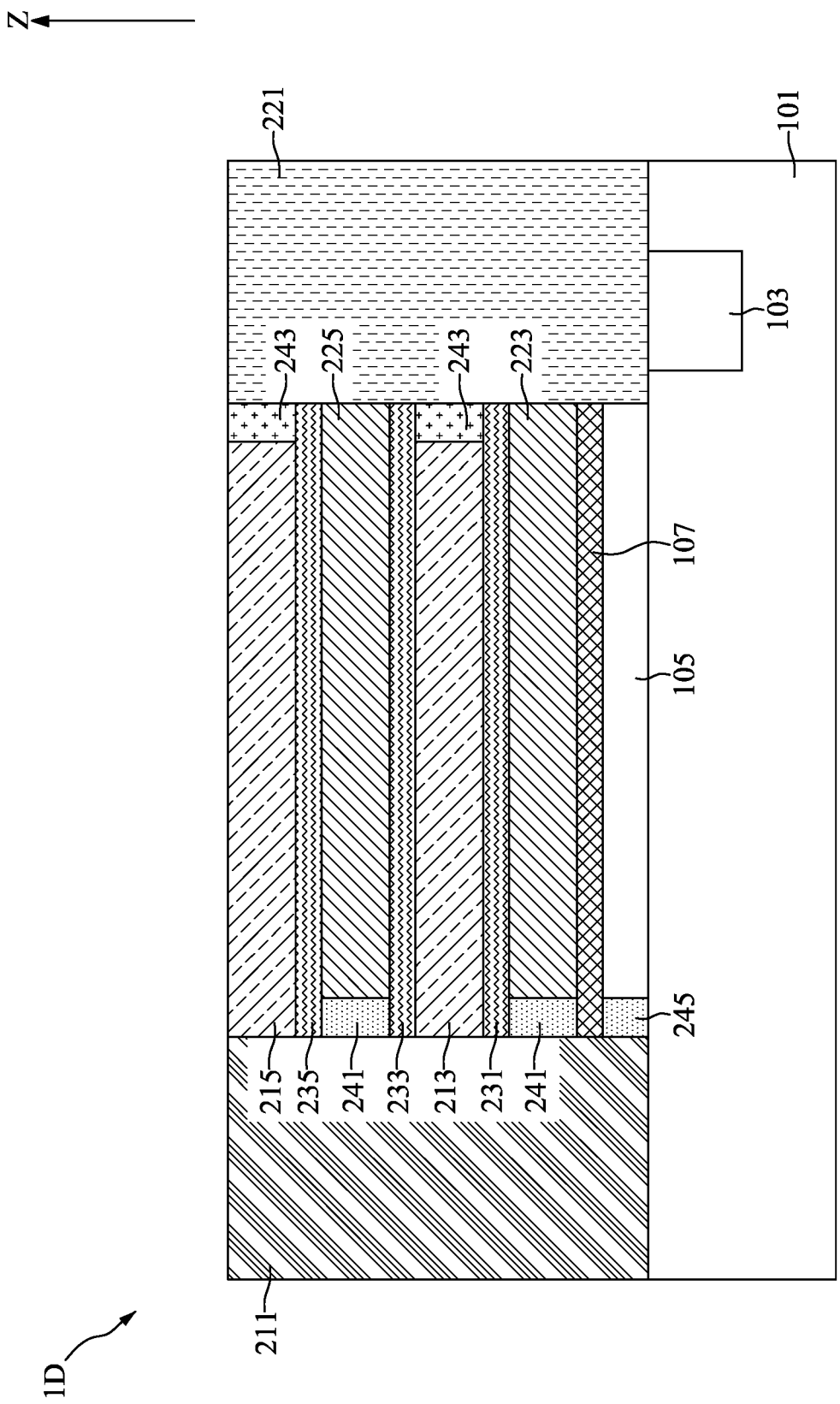

With reference to FIG. 17, the semiconductor device 1D may have a structure similar to that illustrated in FIG. 16. The same or similar elements in FIG. 17 as in FIG. 16 have been marked with similar reference numbers and duplicative descriptions have been omitted. In the semiconductor device 1D, the impurity region 103 may be disposed under the second palm portion 221 and contacting the second palm portion 221.

Figure 18:
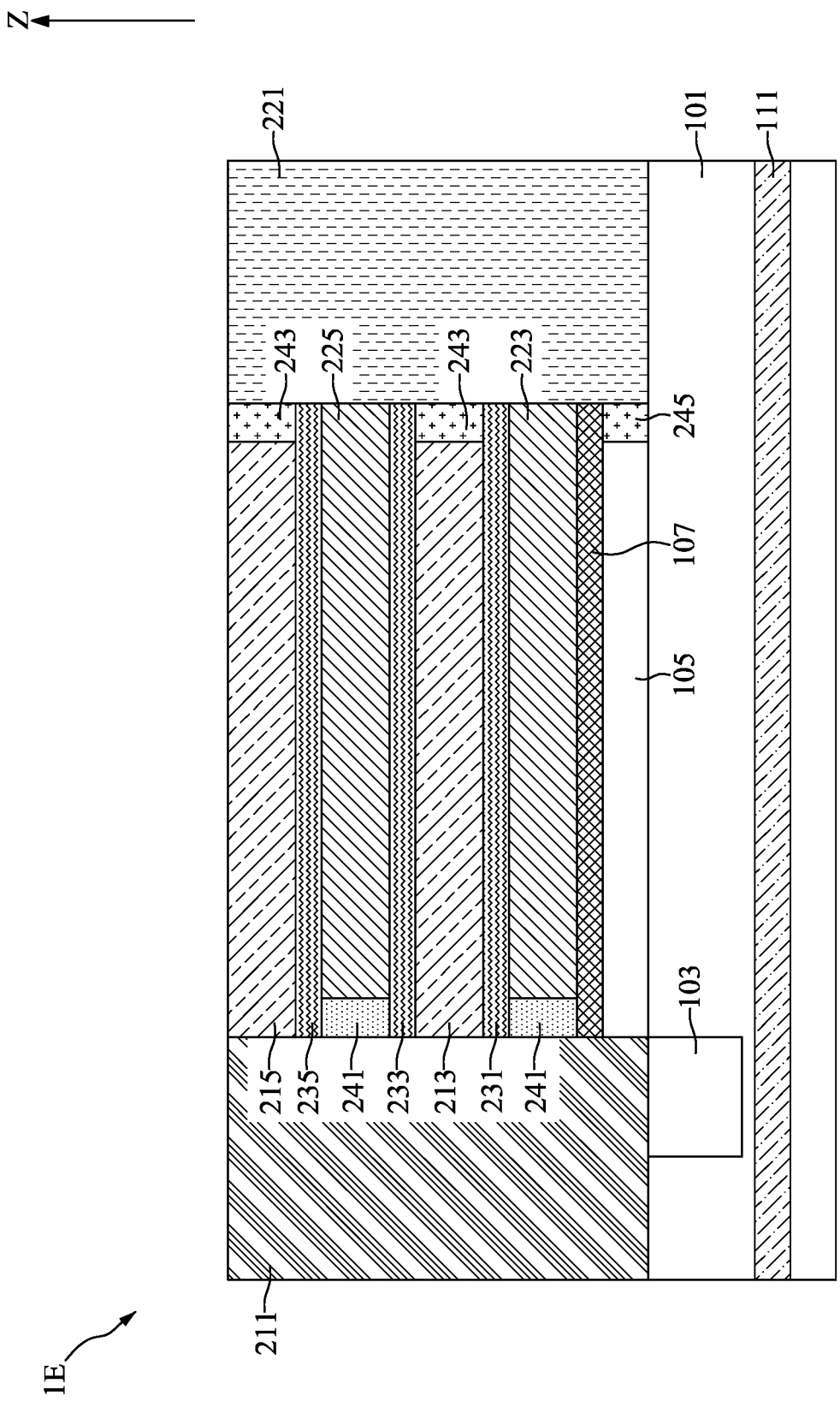

With reference to FIG. 18, the semiconductor device 1E may have a structure similar to that illustrated in FIG. 14. The same or similar elements in FIG. 18 as in FIG. 14 have been marked with similar reference numbers and duplicative descriptions have been omitted. The semiconductor device 1E may include a buried insulation layer 111. The buried insulation layer 111 may be horizontally disposed in the substrate 101. The impurity region 103 may be disposed above the buried insulation layer 111. The buried insulation layer 111 may reduce the current leakage.

FIGS. 19 to 22 illustrate, in schematic cross-sectional view diagrams, a flow for fabricating a semiconductor device 1F in accordance with another embodiment of the present disclosure.

Figure 19:
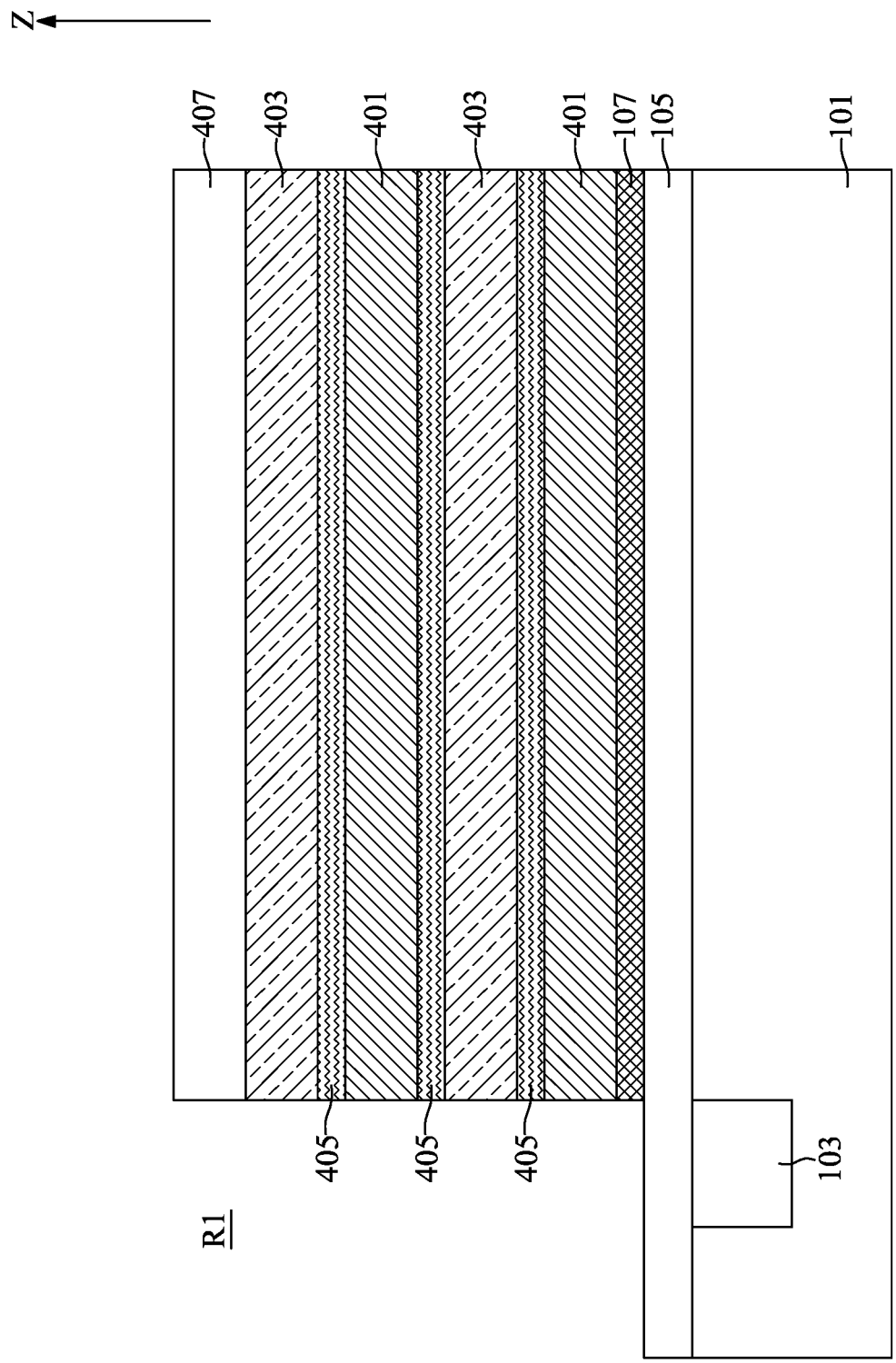
FIGS. 19 to 22 illustrate, in schematic cross-sectional view diagrams, a flow for fabricating a semiconductor device in accordance with another embodiment of the present disclosure.

With reference to FIG. 19, an intermediate semiconductor device may be fabricated with a procedure similar to that illustrated in FIGS. 2 to 6. In contrast to FIG. 6, the stack may have a substantially vertical sidewall after the etch process. In the present embodiment, the first conductive layer 401 is a layer of $Si_{0.50}Ge_{0.50}$ and second conductive layer 403 is a layer of Si.

Figure 20:
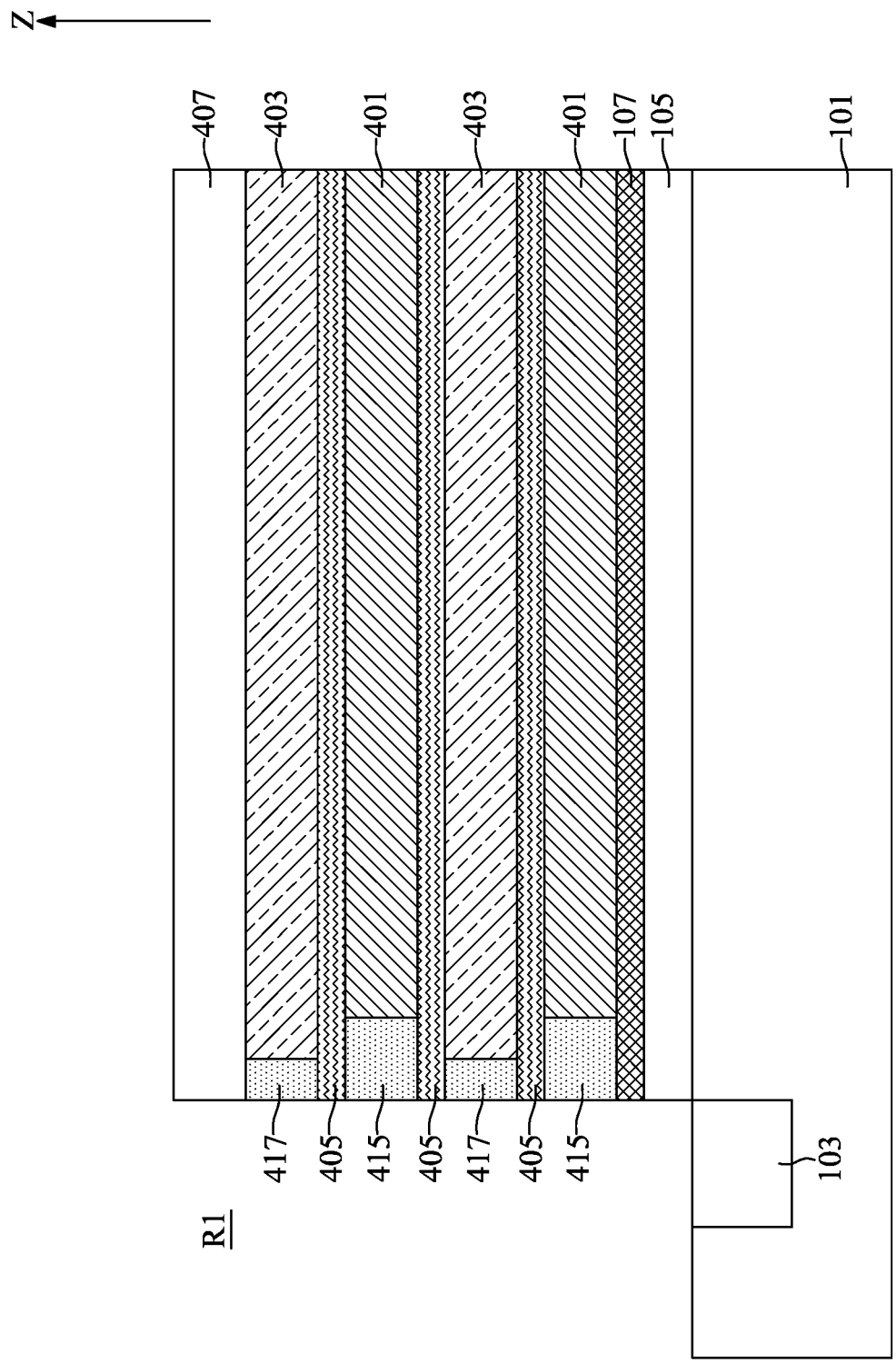

With reference to FIG. 20, a low-temperature oxidation process may be conducted at a process temperature less than 700° C. to oxidize the exposed sidewalls of the plurality of first conductive layers 401 and the second conductive layer 403. In the present embodiment, a wet oxidation conducted at 630° C. is employed. The plurality of first conductive layers 401 formed of $Si_{0.50}Ge_{0.50}$ may oxidize at least ten times faster than the plurality of second conductive layers 403 formed of Si under such condition. As a result, the sacrificial layers 415 formed during the low-temperature oxidation process may be relatively thicker than the sacrificial layers 417 formed during the low-temperature oxidation process.

Figure 21:
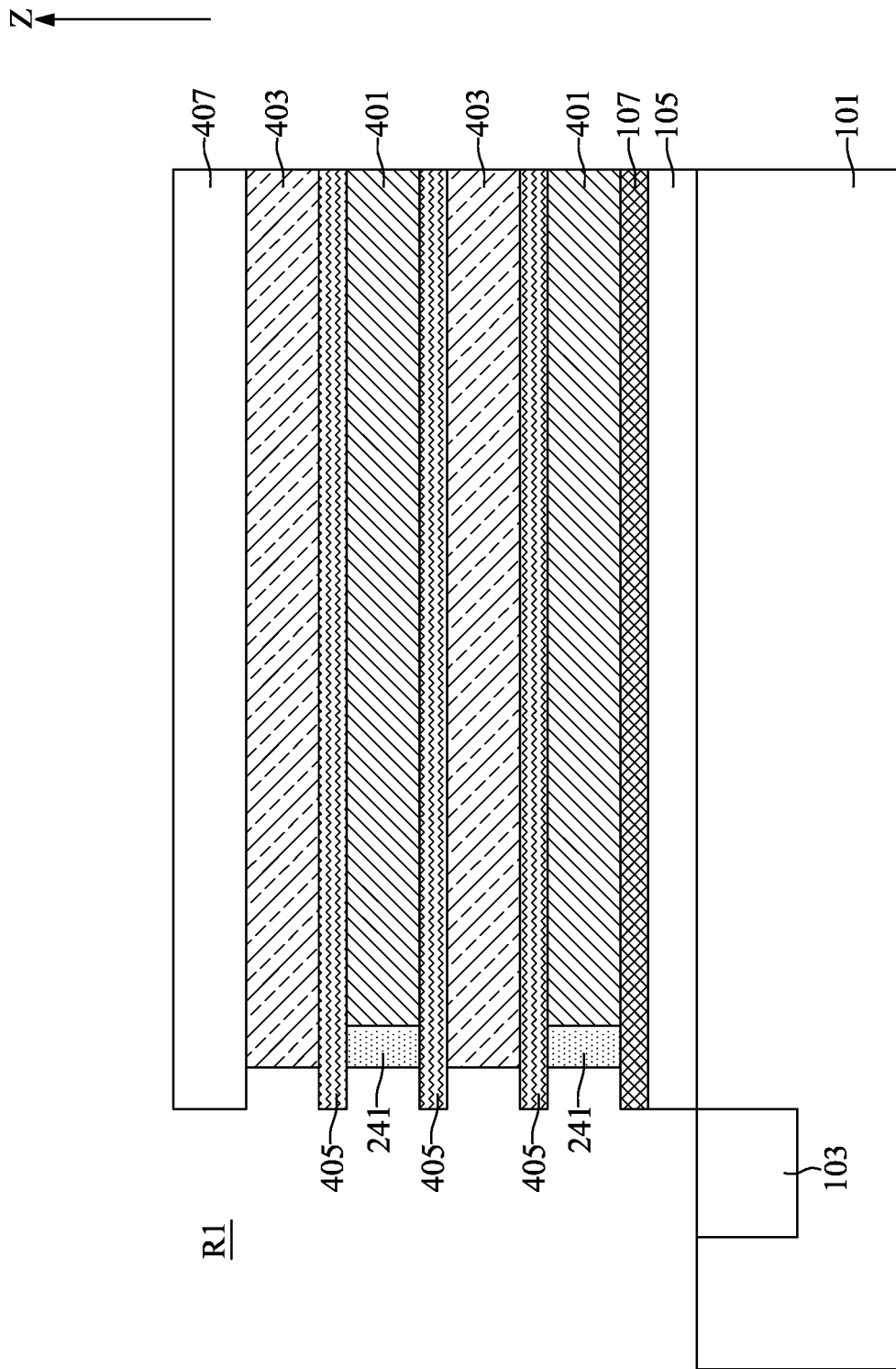

With reference to FIG. 21, an oxide etch process may be performed to remove the sacrificial layers 417. The oxide etch process may be a plasma-assisted dry etch process that involves simultaneous exposure of a substrate to hydrogen, $NF_3$ and $NH_3$ plasma by-products or a wet etch using a solution containing hydrofluoric acid. The exposed plurality of second conductive layers 403 may be served as seed to epitaxially grow first palm portion 211. It should be noted that and portions of the sacrificial layers 415 may also be removed. However, due to the sacrificial layers 415 are thicker than the sacrificial layers 417, the sacrificial layers 415 may still cover the plurality of first conductive layers 401 after the removal of the sacrificial layers 417. The remained sacrificial layers 415 may be referred to as the plurality of first spacers 241.

Figure 22:
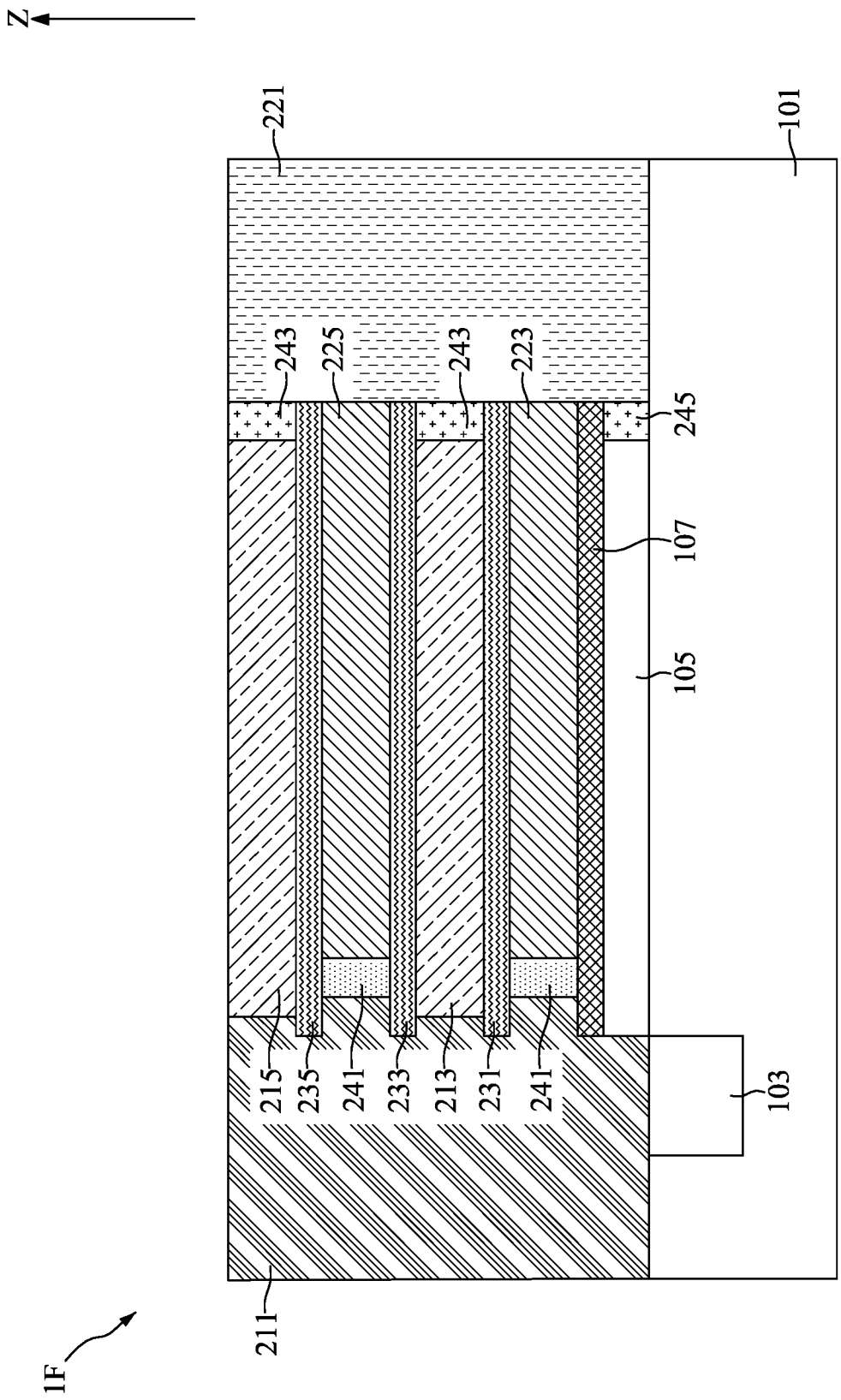

With reference to FIG. 22, the other elements (e.g., the first palm portion 211 and the second palm portion 221) may be formed with a procedure similar to that illustrated in FIGS. 9 to 14. In some embodiments, the capacitor insulation layer 231 extends into the first palm portion 211. In some embodiments, the first spacer 241 has first side facing the first palm portion 211, the capacitor insulation layer 231 has a second side facing the first palm portion, and the first side is not aligned with the second side.

FIGS. 23 to 27 illustrate, in schematic cross-sectional view diagrams, a flow for fabricating a semiconductor device 1G in accordance with another embodiment of the present disclosure.

Figure 23:
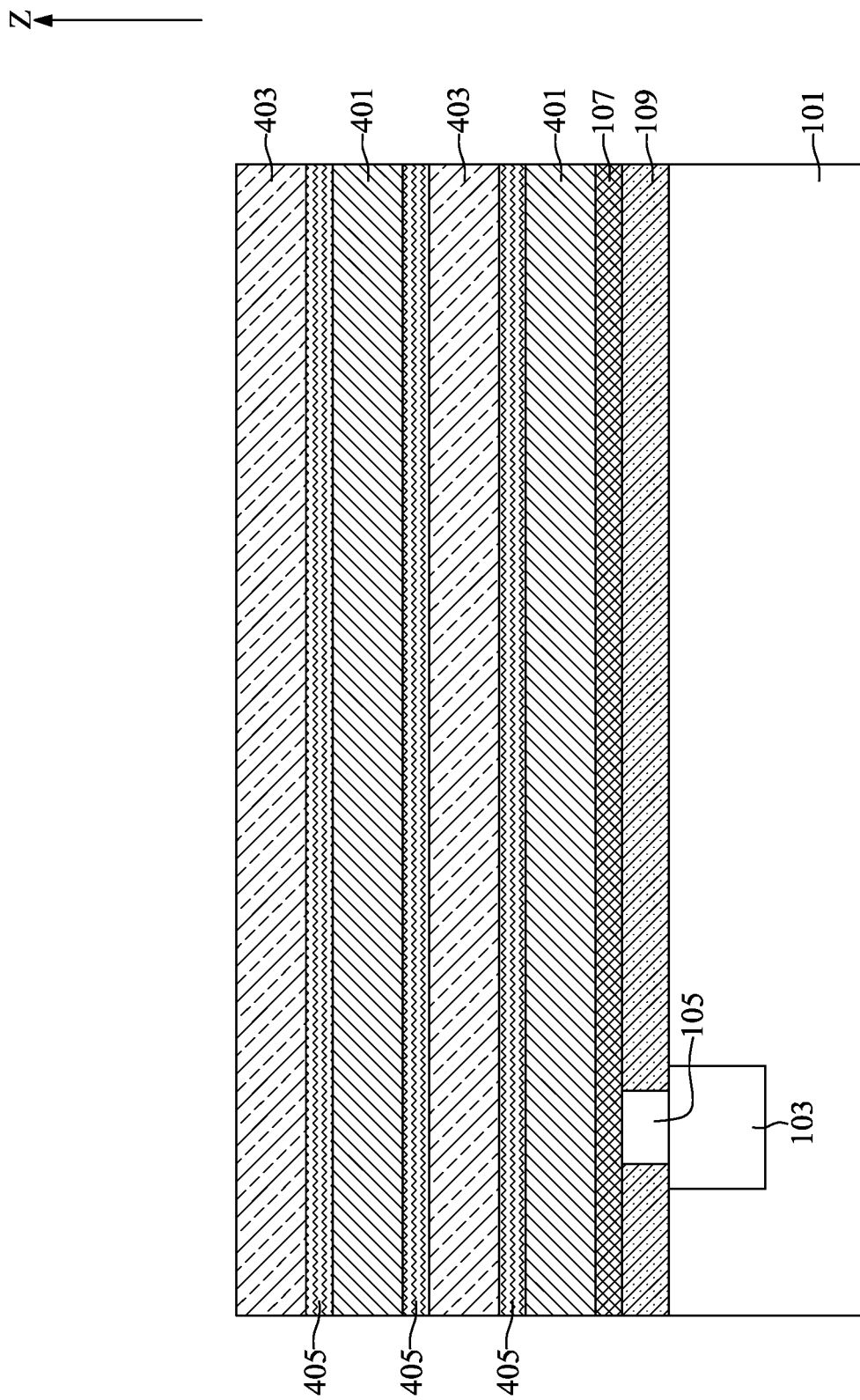
FIGS. 23 to 27 illustrate, in schematic cross-sectional view diagrams, a flow for fabricating a semiconductor device in accordance with another embodiment of the present disclosure.

With reference to FIG. 23, an inter-dielectric layer 109 may be blanket deposited on the substrate 101. The bottom conductive layer 105 may be formed in the bottom conductive layer 105 by, for example, a damascene process or other suitable process. The stop layer 107 may be optionally deposited on the inter-dielectric layer 109. The plurality of first conductive layers 401, the plurality of insulation layers 405, and the plurality of second conductive layers 403 may be sequentially and alternatively formed on the stop layer 107.

Figure 24:
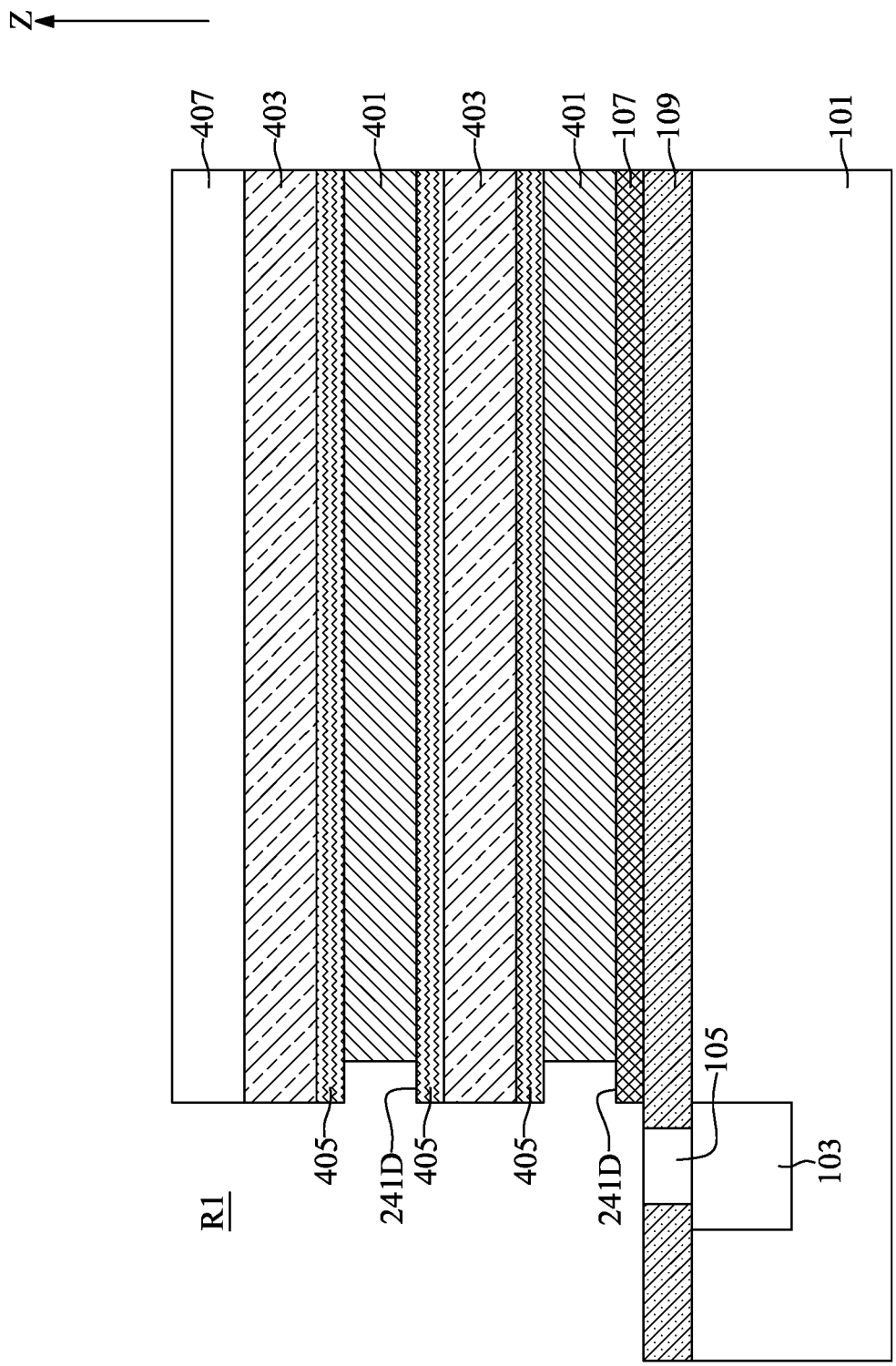

With reference to FIG. 24, the first recess R1 and the plurality of dimples 241D may be formed with a procedure similar to that illustrated in FIGS. 5 and 6. It should be noted that the inter-dielectric layer 109 may be intact after the etch process.

Figure 25:
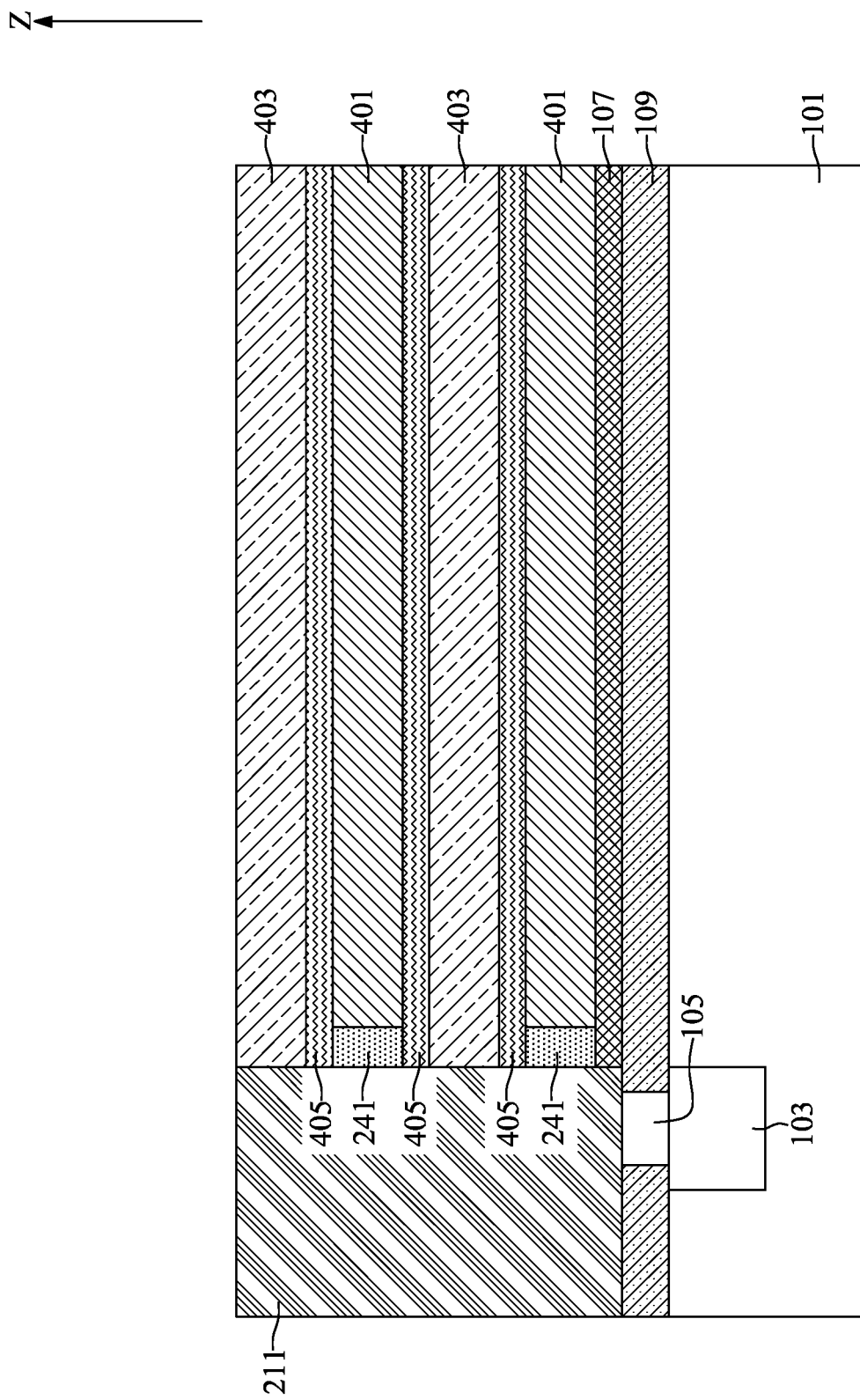

With reference to FIG. 25, the first spacers 241 and the first palm portion 211 may be formed with a procedure similar to that illustrated in FIGS. 7 to 9. The first palm portion 211 may be formed on the inter-dielectric layer 109 and may contact the bottom conductive layer 105. That is, the first palm portion 211 may be electrically coupled to the impurity region 103 through the bottom conductive layer 105.

Figure 26:
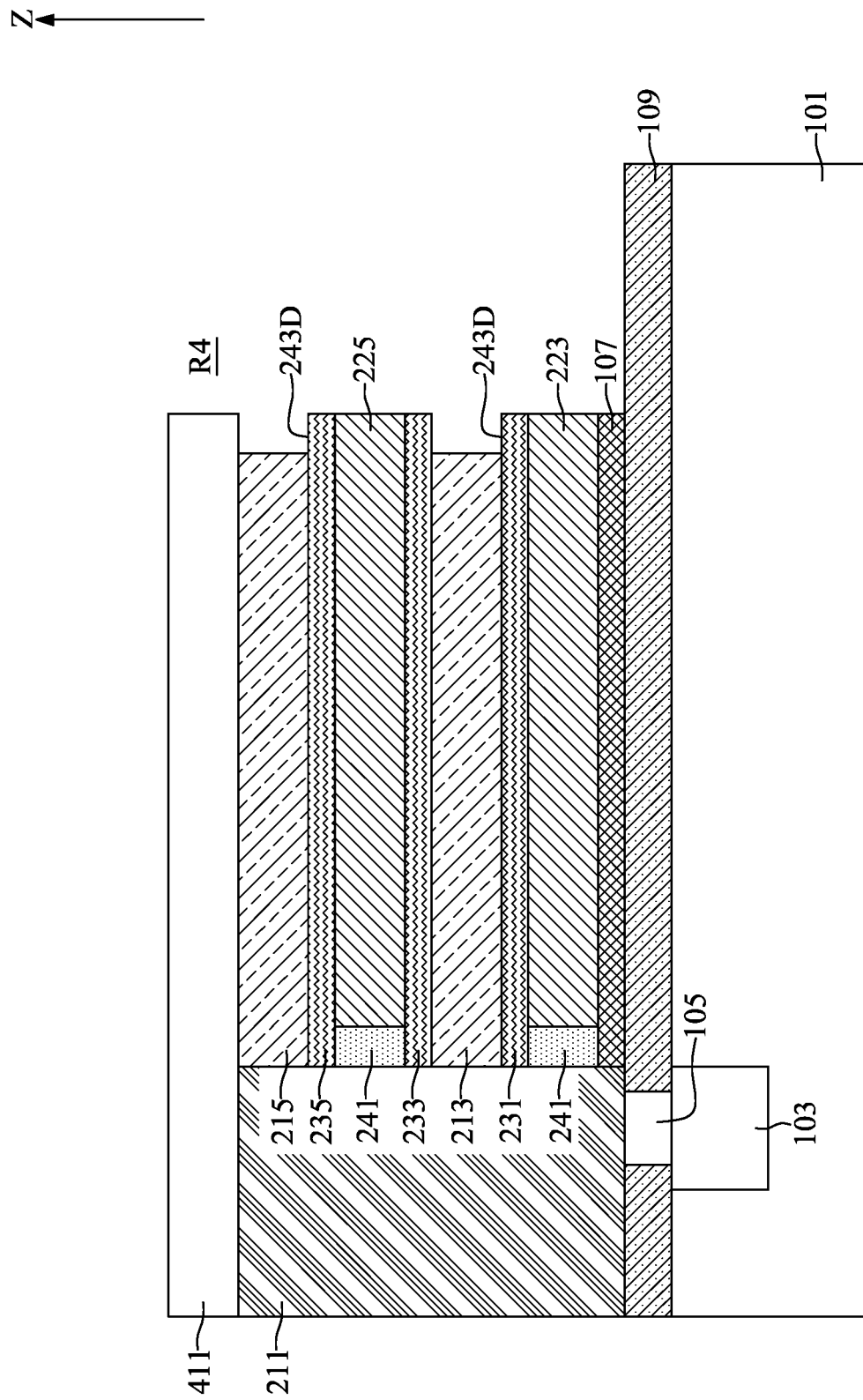

With reference to FIG. 26, the fourth recess R4 and the plurality of dimples 243D may be formed with a procedure similar to that illustrated in FIGS. 10 and 11. It should be noted that the inter-dielectric layer 109 may be intact after the etch process.

Figure 27:
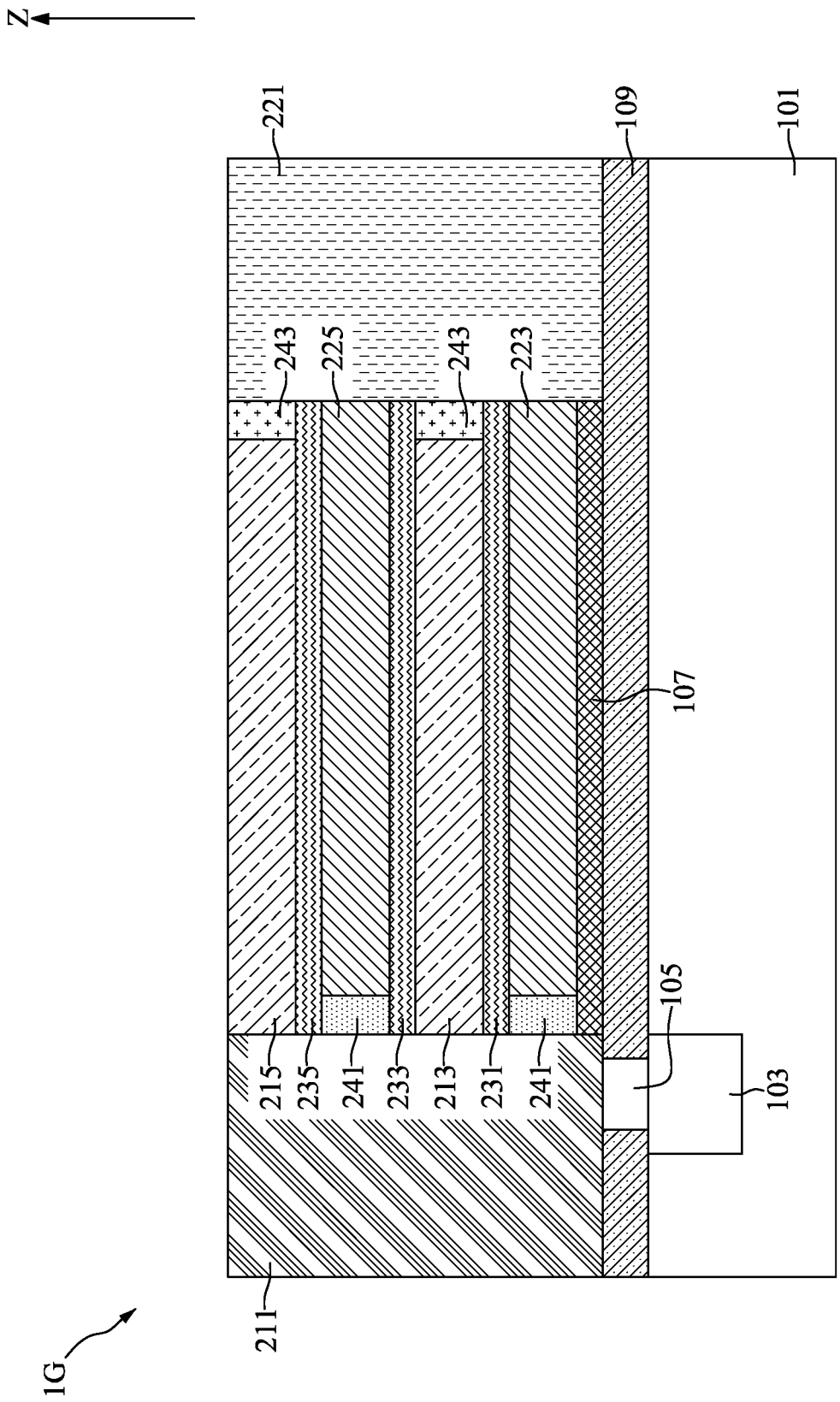

With reference to FIG. 27, the second spacers 243 and the second palm portion 221 may be formed with a procedure similar to that illustrated in FIGS. 12 to 14.

Figure 28:
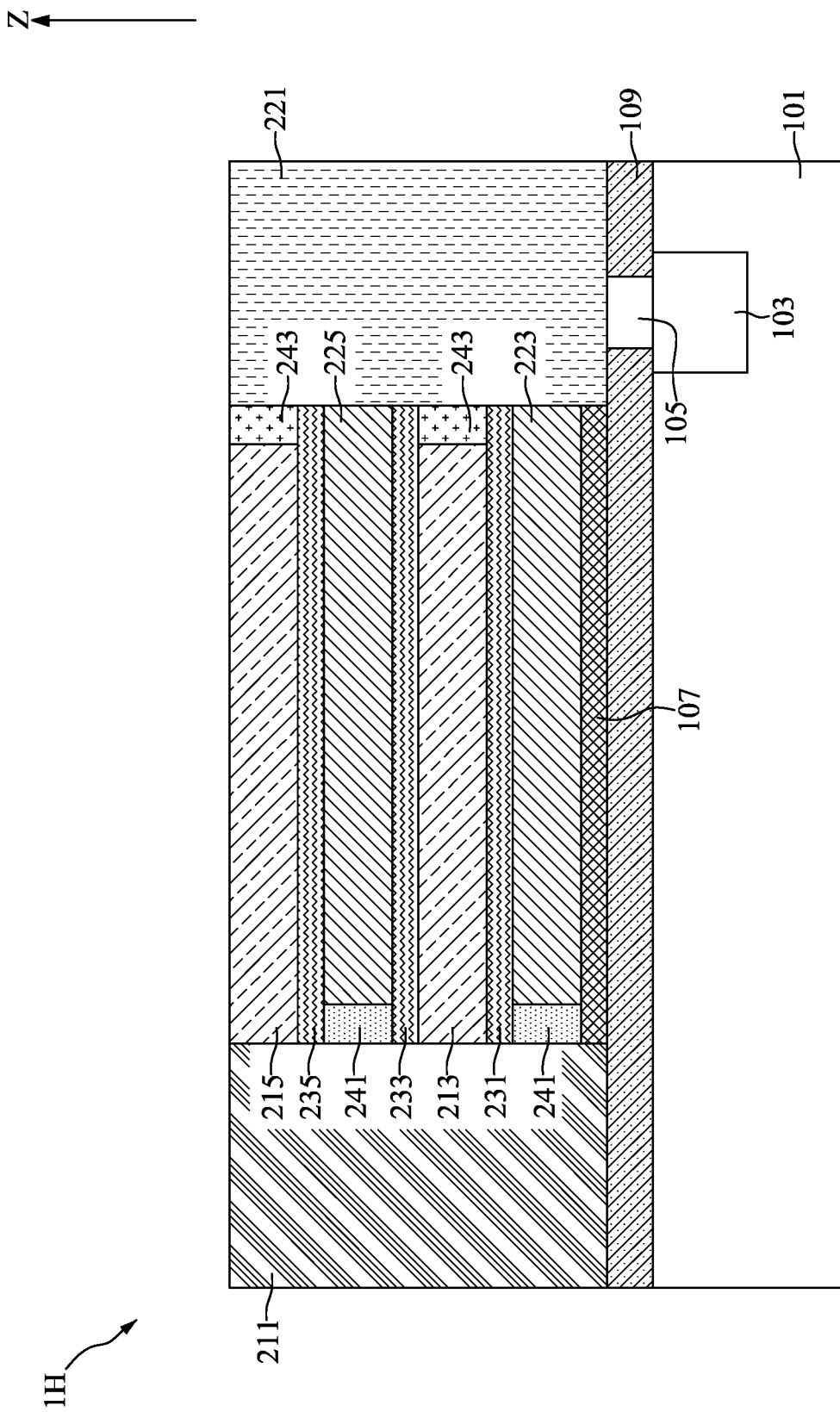
FIG. 28 illustrates, in a schematic cross-sectional view diagram, a semiconductor device in accordance with another embodiment of the present disclosure.

FIG. 28 illustrates, in a schematic cross-sectional view diagram, a semiconductor device 1H in accordance with another embodiment of the present disclosure.

With reference to FIG. 28, the semiconductor device 1H may have a structure similar to that illustrated in FIG. 27. The same or similar elements in FIG. 28 as in FIG. 27 have been marked with similar reference numbers and duplicative descriptions have been omitted. In the semiconductor device 1H, the impurity region 103 may be disposed under the second palm portion 221. The second palm portion 221 and the impurity region 103 may be electrically coupled through the bottom conductive layer 105 interposed therebetween.

One aspect of the present disclosure provides a semiconductor device including a first palm portion positioned above a substrate; a second palm portion positioned above the substrate and opposite to the first palm portion; a first finger portion arranged substantially in parallel with a main surface of the substrate, positioned between the first palm portion and the second palm portion, and connecting to the first palm portion; a second finger portion arranged substantially in parallel with the first finger portion, positioned between the first palm portion and the second palm portion, and connecting to the second palm portion; a capacitor insulation layer positioned between the first finger portion and the second finger portion; a first spacer positioned between the first palm portion and second finger portion; and a second spacer positioned between the second palm portion and the first finger portion.

Another aspect of the present disclosure provides a method for fabricating a semiconductor device including providing a substrate; sequentially forming a first conductive layer, an insulation layer, and a second conductive layer over the substrate to configure a stack; patterning the stack to form a first recess and expose an impurity region in the substrate; forming a first spacer to cover a sidewall of the first conductive layer; forming a first palm portion in the first recess and connecting to the second conductive layer; patterning the stack to form a third recess, turn the second conductive layer into a first finger portion, and turn the first conductive layer into a second finger portion, wherein the third recess is opposite to the first palm portion; forming a second spacer to cover a sidewall of the first finger portion, wherein the second spacer is opposite to the first palm portion; and forming a second palm portion in the third recess and connecting to the second finger portion.

Due to the design of the semiconductor device of the present disclosure, the contact area of the capacitor structure may be increased. As a result, the performance of the semiconductor device 1A may be improved. In addition, the process flow may be easily integrated with fin type transistors.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first palm portion positioned above a substrate;
a second palm portion positioned above the substrate and opposite to the first palm portion;
a first finger portion arranged substantially in parallel with a main surface of the substrate, positioned between the first palm portion and the second palm portion, and connecting to the first palm portion;
a second finger portion arranged substantially in parallel with the first finger portion, positioned between the first palm portion and the second palm portion, and connecting to the second palm portion;
a capacitor insulation layer positioned between the first finger portion and the second finger portion;
a first spacer positioned between the first palm portion and second finger portion; and
a second spacer positioned between the second palm portion and the first finger portion;
wherein the capacitor insulation layer extends into the first palm portion;
wherein the first spacer has first side facing the first palm portion, the capacitor insulation layer has a second side facing the first palm portion, and the first side is not aligned with the second side.

2. The semiconductor device of claim 1, further comprising a bottom conductive layer arranged substantially in parallel with the second finger portion, positioned between the first palm portion and the second palm portion, and connecting to the first palm portion.

3. The semiconductor device of claim 2, further comprising a third spacer positioned between the bottom conductive layer and the second palm portion.

4. The semiconductor device of claim 3, further comprising an impurity region positioned in the substrate;
wherein the first palm portion is positioned on the impurity region and contacting the impurity region.

5. The semiconductor device of claim 3, further comprising an impurity region positioned in the substrate;
wherein the second palm portion is positioned on the impurity region and contacting the impurity region.

6. The semiconductor device of claim 4, further comprising a stop layer arranged substantially in parallel with the capacitor insulation layer and positioned between the second finger portion and the bottom conductive layer.

7. The semiconductor device of claim 1, further comprising a bottom conductive layer arranged substantially in parallel with the second finger portion, positioned between the first palm portion and the second palm portion, and connecting to the second palm portion.

8. The semiconductor device of claim 7, further comprising a third spacer positioned between the bottom conductive layer and the first palm portion.

9. The semiconductor device of claim 8, further comprising an impurity region positioned in the substrate;
wherein the first palm portion is positioned on the impurity region and contacting the impurity region.

10. The semiconductor device of claim 8, further comprising an impurity region positioned in the substrate;
   wherein the second palm portion is positioned on the impurity region and contacting the impurity region.

11. The semiconductor device of claim 1, further comprising an impurity region positioned in the substrate;
   wherein the first palm portion is electrically coupled to the impurity region through a bottom conductive layer.

12. The semiconductor device of claim 1, further comprising an impurity region positioned in the substrate;
   wherein the second palm portion is electrically coupled to the impurity region through a bottom conductive layer.

13. The semiconductor device of claim 6, further comprising a buried insulation layer positioned in the substrate;
   wherein the impurity region is positioned above the buried insulation layer.

14. The semiconductor device of claim 1, wherein a thickness of the first finger portion and a thickness of the second finger portion are different.

15. The semiconductor device of claim 1, wherein a width of the first finger portion and a width of the second finger portion are different.

16. The semiconductor device of claim 1, wherein a width of the first spacer and a width of the second spacer are different.

17. The semiconductor device of claim 2, wherein a thickness of the bottom conductive layer and a thickness of the second finger portion are different.

* * * * *